US012787410B2

(12) United States Patent
Kim et al.

(10) Patent No.: US 12,787,410 B2
(45) Date of Patent: Nov. 3, 2026

(54) SEMICONDUCTOR POWER DEVICES HAVING MULTIPLE GATE TRENCHES AND METHODS OF FORMING SUCH DEVICES

(71) Applicant: Wolfspeed, Inc., Durham, NC (US)

(72) Inventors: Woongsun Kim, Cary, NC (US); Daniel Jenner Lichtenwalner, Raleigh, NC (US); Sei-Hyung Ryu, Cary, NC (US); Naeem Islam, Morrisville, NC (US)

(73) Assignee: WOLFSPEED, INC., Durham, NC (US)

( * ) Notice: Subject to any disclaimer, the term of this patent is extended or adjusted under 35 U.S.C. 154(b) by 0 days.

(21) Appl. No.: 18/302,843

(22) Filed: Apr. 19, 2023

(65) Prior Publication Data

US 2023/0261073 A1 Aug. 17, 2023

Related U.S. Application Data

(63) Continuation of application No. 17/097,617, filed on Nov. 13, 2020, now Pat. No. 11,664,434.

(51) Int. Cl.
*H10D 64/27* (2025.01)
*H10D 12/00* (2025.01)
(Continued)

(52) U.S. Cl.
CPC ......... *H10D 64/513* (2025.01); *H10D 12/031* (2025.01); *H10D 30/668* (2025.01);
(Continued)

(58) Field of Classification Search
CPC ............. H01L 29/4236; H01L 29/1045; H01L 29/42376; H01L 29/7813; H01L 29/7397;
(Continued)

(56) References Cited

U.S. PATENT DOCUMENTS 6,433,385 B1 * 8/2002 Kocon ................. H10D 30/668 257/E29.066
10,199,466 B1 * 2/2019 Kyogoku .......... H01L 29/66068
(Continued)

FOREIGN PATENT DOCUMENTS

| | | | | |
|---|---|---|---|---|
| JP | 2006093193 A | * 4/2006 | | ......... H01L 29/0623 |
| JP | 2014207326 A | * 10/2014 | | |
| JP | 2018186270 A | 11/2018 | | |
| JP | 2019096711 A | 6/2019 | | |
| JP | 2020057635 A | 4/2020 | | |

OTHER PUBLICATIONS

Notification of Transmittal of the International Search Report and the Written Opinion of the International Searching Authority, or the Declaration, in corresponding PCT Application No. PCT/US2021/058930 (Feb. 23, 2022).

*Primary Examiner* — Igwe U Anya
(74) *Attorney, Agent, or Firm* — Myers Bigel, P.A.

(57) ABSTRACT

A semiconductor device includes a semiconductor layer structure and a gate formed in a gate trench in the semiconductor layer structure. The gate trench has a bottom surface comprising a first portion at a first level and a second portion at a second level, different from the first level. A method of forming a semiconductor device includes providing a semiconductor layer structure, etching a first gate trench into the semiconductor layer structure, etching a second gate trench into the semiconductor layer structure, and performing an ion implantation into a bottom surface of the second gate trench. The second gate trench is deeper than the first gate trench, and at least a portion of the second gate trench is connected to the first gate trench.

25 Claims, 16 Drawing Sheets

(51) Int. Cl.

| | |
|---|---|
| ***H10D 12/01*** | (2025.01) |
| ***H10D 30/66*** | (2025.01) |
| ***H10D 62/17*** | (2025.01) |
| ***H10D 62/832*** | (2025.01) |
| ***H10P 30/22*** | (2026.01) |
| ***H10P 50/00*** | (2026.01) |

(52) U.S. Cl.
CPC ....... *H10D 62/307* (2025.01); *H10D 62/8325* (2025.01); *H10D 64/518* (2025.01); *H10D 12/481* (2025.01); *H10P 30/22* (2026.01); *H10P 50/00* (2026.01)

(58) Field of Classification Search
CPC ............. H10D 62/307; H10D 62/8325; H10D 64/513; H10D 64/518; H10D 30/668; H10D 12/031; H10D 12/481
USPC .......................................................... 257/330
See application file for complete search history.

(56) References Cited

U.S. PATENT DOCUMENTS

| | | | | |
|---|---|---|---|---|
| 2010/0015803 | A1* | 1/2010 | Yang ................. | H01L 21/76808 257/E21.582 |
| 2013/0224919 | A1 | 8/2013 | Ding et al. | |
| 2014/0167151 | A1 | 6/2014 | Yen et al. | |
| 2014/0175540 | A1 | 6/2014 | Bobde et al. | |
| 2014/0361349 | A1* | 12/2014 | Alexandrov ........ | H01L 29/0619 438/192 |
| 2016/0141409 | A1* | 5/2016 | Takaya ............... | H10D 30/0297 438/270 |
| 2016/0149029 | A1* | 5/2016 | Takaya ................ | H01L 29/0878 438/270 |
| 2016/0260798 | A1 | 9/2016 | Rupp et al. | |
| 2018/0122931 | A1 | 5/2018 | Siemieniec et al. | |
| 2018/0308938 | A1* | 10/2018 | Siemieniec ......... | H01L 29/0696 |
| 2019/0198619 | A1 | 6/2019 | Ijima et al. | |
| 2019/0259841 | A1 | 8/2019 | Stegner et al. | |
| 2021/0408279 | A1 | 12/2021 | Siemieniec et al. | |
| 2022/0085205 | A1 | 3/2022 | Kim et al. | |

* cited by examiner

SEMICONDUCTOR POWER DEVICES HAVING MULTIPLE GATE TRENCHES AND METHODS OF FORMING SUCH DEVICES

CROSS-REFERENCE TO RELATED APPLICATION

The present application is a continuation of and claims priority to U.S. patent application Ser. No. 17/097,617, filed Nov. 13, 2020, the entire contents of which are incorporated by reference herein.

FIELD

The present invention relates to semiconductor devices and, more particularly, to power semiconductor switching devices.

BACKGROUND

The Metal Insulating Semiconductor Field Effect Transistor ("MISFET") is a well-known type of semiconductor transistor that may be used as a switching device. A MISFET is a three terminal device that has gate, drain and source terminals, and a semiconductor body. A source region and a drain region are formed in the semiconductor body that are separated by a channel region, and a gate electrode (which may act as the gate terminal or be electrically connected to the gate terminal) is disposed adjacent the channel region. A MISFET may be turned on or off by applying a bias voltage to the gate electrode. When a MISFET is turned on (i.e., it is in its "on-state"), current is conducted through the channel region of the MISFET between the source region and drain regions. When the bias voltage is removed from the gate electrode (or reduced below a threshold level), the current ceases to conduct through the channel region. By way of example, an n-type MISFET has n-type source and drain regions and a p-type channel. An n-type MISFET thus has an "n-p-n" design. An n-type MISFET turns on when a gate bias voltage is applied to the gate electrode that is sufficient to create a conductive n-type inversion layer in the p-type channel region that electrically connects the n-type source and drain regions, thereby allowing for majority carrier conduction therebetween.

The gate electrode of a power MISFET is typically separated from the channel region by a thin gate dielectric layer. In most cases, the gate dielectric layer is an oxide layer (e.g., a silicon oxide layer). A MISFET that has an oxide gate dielectric layer is referred to as a Metal Oxide Semiconductor Field Effect Transistor ("MOSFET"). As oxide gate dielectric layers are frequently used due to their superior properties, the discussion herein will focus on MOSFETs as opposed to MISFETs, but it will be appreciated that the techniques according to embodiments of the present invention that are described herein are equally applicable to devices having gate dielectric layers formed with materials other than oxides.

Because the gate electrode of the MOSFET is insulated from the channel region by the gate dielectric layer, minimal gate current is required to maintain the MOSFET in its on-state or to switch a MOSFET between its on-state and its off-state. The gate current is kept small during switching because the gate forms a capacitor with the channel region. Thus, only minimal charging and discharging current is required during switching, allowing for less complex gate drive circuitry and faster switching speeds. MOSFETs may be stand-alone devices or may be combined with other circuit devices. For example, an Insulated Gate Bipolar Transistor ("IGBT") is a semiconductor device that includes both a MOSFET and a Bipolar Junction Transistor ("BJT") that combines the high impedance gate electrode of the MOSFET with small on-state conduction losses that may be provided by a BJT. An IGBT may be implemented, for example, as a Darlington pair that includes a high voltage n-channel MOSFET at the input and a BJT at the output. The base current of the BJT is supplied through the channel of the MOSFET, thereby allowing a simplified external drive circuit (since the drive circuit only charges and discharges the gate electrode of the MOSFET).

There is an increasing demand for high power semiconductor switching devices that can pass large currents in their "on" state and block large voltages (e.g., thousands of volts) in their reverse blocking state. In order to support high current densities and block such high voltages, power MOSFETs and IGBTs typically have a vertical structure with the source and drain on opposite sides of a thick semiconductor layer structure in order to block higher voltage levels. In very high power applications, the semiconductor switching devices are typically formed in wide band-gap semiconductor material systems (herein, the term "wide band-gap semiconductor" encompasses any semiconductor having a band-gap of at least 1.4 eV) such as, for example, silicon carbide ("SiC"), which has a number of advantageous characteristics including, for example, a high electric field breakdown strength, high thermal conductivity, high melting point, and high-saturated electron drift velocity. Relative to devices formed using other semiconductor materials such as, for example, silicon, electronic devices formed using silicon carbide may have the capability of operating at higher temperatures, at high power densities, at higher speeds, at higher power levels, and/or under high radiation densities.

A conventional power semiconductor device typically has a semiconductor substrate, such as a silicon carbide substrate having a first conductivity type (e.g., an n-type substrate), on which an epitaxial layer structure having the first conductivity type (e.g., n-type) is formed. A portion of this epitaxial layer structure (which may comprise one or more separate layers) functions as a drift region of the power semiconductor device. The device typically includes an "active region," which includes one or more power semiconductor devices that have a junction such as a p-n junction. The active region may be formed on and/or in the drift region. The active region acts as a main junction for blocking voltage in the reverse bias direction and providing current flow in the forward bias direction. The power semiconductor device may also have an edge termination in a termination region that is adjacent the active region. One or more power semiconductor devices may be formed on the substrate, and each power semiconductor device will typically have its own edge termination. After the substrate is fully processed, the resultant structure may be diced to separate the individual edge-terminated power semiconductor devices. The power semiconductor devices may have a unit cell structure in which the active region of each power semiconductor device includes a plurality of individual "unit cell" devices that are disposed in parallel to each other and that together function as a single power semiconductor device.

Power semiconductor devices are designed to block (in the forward or reverse blocking state) or pass (in the forward operating state) large voltages and/or currents. For example, in the blocking state, a power semiconductor device may be designed to sustain hundreds or thousands of volts of electric potential. However, as the applied voltage approaches or passes the voltage level that the device is designed to block, non-trivial levels of current may begin to flow through the power semiconductor device. Such current, which is typically referred to as "leakage current," may be highly undesirable. Leakage current may begin to flow if the voltage is increased beyond the design voltage blocking capability of the device, which may be a function of, among other things, the doping and thickness of the drift region. Leakage currents may also arise for other reasons, such as failure of the edge termination and/or the primary junction of the device. If the voltage applied to the device is increased past the breakdown voltage to a critical level, the increasing electric field may result in an uncontrollable and undesirable run-away generation of charge carriers within the semiconductor device, leading to a condition known as avalanche breakdown.

A power semiconductor device may also begin to allow non-trivial amounts of leakage current to flow at a voltage level that is lower than the designed breakdown voltage of the device. In particular, leakage current may begin to flow at the edges of the active region, where high electric fields may occur due to electric field crowding effects. In order to reduce this electric field crowding (and the resulting increased leakage currents), the above-mentioned edge terminations may be provided that surround part or all of the active region of a power semiconductor device. These edge terminations may spread the electric field out over a greater area, thereby reducing the electric field crowding.

Vertical power semiconductor devices that include a MOSFET transistor can have a standard gate electrode design in which the gate electrode of the transistor is formed on top of the semiconductor layer structure or, alternatively, may have the gate electrode buried in a trench within the semiconductor layer structure. MOSFETs having buried gate electrodes are typically referred to as gate trench MOSFETs. With the standard gate electrode design, the channel region of each unit cell transistor is horizontally disposed underneath the gate electrode. In contrast, in the gate trench MOSFET design, the channel is vertically disposed. Gate trench MOSFETs may provide enhanced performance, but typically utilize a more complicated manufacturing process.

SUMMARY

Pursuant to embodiments of the present invention, semiconductor devices are provided that have an improved gate trench structure that incorporates a recess in the bottom surface of the gate trench, and a doped well adjacent thereto, to improve a blocking and/or conductivity performance of the device.

According to some embodiments of the present invention, a semiconductor device, includes a semiconductor layer structure and a gate formed in a gate trench in the semiconductor layer structure. The gate trench has a bottom surface comprising a first portion at a first level and a second portion at a second level, different from the first level In some embodiments, the semiconductor layer structure comprises a substrate, and the second level is closer to the substrate than the first level.

In some embodiments, the substrate comprises silicon carbide.

In some embodiments, the semiconductor layer structure comprises a drift region having a first conductivity type, a well region having a second conductivity type on the drift region, and a deep shielding pattern having the second conductivity type below at least a portion of the bottom surface of the gate trench.

In some embodiments, the deep shielding pattern extends to contact at least a portion of the well region.

In some embodiments, the gate trench further comprises a first corner between a sidewall of the gate trench and the first portion of the bottom surface of the gate trench and a second corner between the first portion of the bottom surface of the gate trench and the second portion of the bottom surface of the gate trench.

In some embodiments, a second radius of curvature of the second corner is greater than a first radius of curvature of the first corner.

In some embodiments, the deep shielding pattern is between the second corner and the drift region.

In some embodiments, the bottom surface of the gate trench further comprises a third portion at a third level, and the third portion of the bottom surface of the gate trench is on an opposite side of the second portion of the gate trench from the first portion of the gate trench.

In some embodiments, the first level and the third level are at approximately the same level.

According to some embodiments of the present invention, a semiconductor device, includes a substrate having a first conductivity type, a drift region having the first conductivity type on the substrate, a well region having a second conductivity type on the drift region, and a gate trench that penetrates into the well region and the drift region. The gate trench has a non-linear bottom surface comprising a recess that extends towards the substrate.

In some embodiments, the semiconductor device further includes a deep shielding pattern having the second conductivity type below at least a portion of the bottom surface of the gate trench.

In some embodiments, the deep shielding pattern extends to contact at least a portion of the well region.

In some embodiments, the deep shielding pattern extends on the recess in the bottom surface of the gate trench.

In some embodiments, a first portion of the bottom surface of the gate trench is at a first level, and a second portion of the bottom surface of the gate trench is at a second level, different from the first level.

In some embodiments, the second portion of the bottom surface of the gate trench is within the recess.

In some embodiments, the bottom surface of the gate trench further comprises a third portion at a third level, and the third portion of the bottom surface of the gate trench is on an opposite side of the second portion of the gate trench from the first portion of the gate trench.

In some embodiments, the first level and the third level are at approximately the same level.

In some embodiments, the gate trench further comprises a first corner between a sidewall of the gate trench and the first portion of the bottom surface of the gate trench and a second corner between the first portion of the bottom surface of the gate trench and the recess.

In some embodiments, the recess is within a central portion of the bottom surface of the gate trench, and portions of the bottom surface are on opposite sides of the recess.

According to some embodiments of the present invention, a method of forming a semiconductor device includes providing a semiconductor layer structure, etching a first gate trench into the semiconductor layer structure, etching a second gate trench into the semiconductor layer structure, and performing an ion implantation into a bottom surface of the second gate trench. The second gate trench is deeper than the first gate trench, and at least a portion of the second gate trench is connected to the first gate trench.

In some embodiments, etching the second gate trench is preceded by forming a mask on at least a portion of the first gate trench.

In some embodiments, the method further includes forming a gate insulating layer on the first gate trench and the second gate trench and forming a gate electrode on the gate insulating layer.

In some embodiments, etching the second gate trench is performed before etching the first gate trench.

In some embodiments, etching the first gate trench is preceded by forming a mask on at least a portion of the second gate trench.

In some embodiments, the second gate trench extends through a central portion of a bottom surface of the first gate trench, and portions of the bottom surface of the first gate trench are on opposite sides of the second gate trench.

In some embodiments, the semiconductor layer structure comprises a drift region having a first conductivity type, and the method further comprises processing a corner of the drift region at an interface between the first gate trench and the second gate trench to increase a radius of curvature of the corner.

In some embodiments, performing the ion implantation into the bottom surface of the second gate trench comprises performing an angled ion implant.

In some embodiments, the semiconductor layer structure comprises a drift region having a first conductivity type and a well region having a second conductivity type, and performing the ion implantation into the bottom surface of the second gate trench comprises performing the ion implantation of a deep shielding pattern having the second conductivity type into a sidewall and the bottom surface of the second gate trench.

In some embodiments, the deep shielding pattern extends to contact at least a portion of the well region.

According to some embodiments of the present invention, a semiconductor device includes a substrate having a first conductivity type, a drift region having the first conductivity type on the substrate, a well region having a second conductivity type on the drift region, and a gate trench that penetrates into the well region and the drift region. The gate trench has a bottom surface comprising a first portion and a second portion, wherein the second portion is closer to the substrate than the first portion.

In some embodiments, the semiconductor device further includes a deep shielding pattern having the second conductivity type on the second portion of the bottom surface of the gate trench.

In some embodiments, the deep shielding pattern extends to contact at least a portion of the well region.

In some embodiments, the bottom surface of the gate trench further comprises a third portion, and the third portion of the bottom surface of the gate trench is on an opposite side of the second portion of the gate trench from the first portion of the gate trench.

In some embodiments, the gate trench further comprises a first corner between a first sidewall of the gate trench and the first portion of the bottom surface of the gate trench and a second corner between the first portion of the bottom surface of the gate trench and a second sidewall of the gate trench, wherein the second sidewall extends between the first portion and the second portion of the bottom surface of the gate trench.

In some embodiments, a second radius of curvature of the second corner is greater than a first radius of curvature of the first corner.

In some embodiments, the semiconductor device further includes a deep shielding pattern having the second conductivity type and the deep shielding pattern is between the second corner of the gate trench and the drift region.

In some embodiments, at least a portion of the first corner of the gate trench directly contacts the drift region without the deep shielding pattern between the portion of the first corner and the drift region.

In some embodiments, a ratio of a first depth of the first sidewall to a second depth of the second sidewall is between 1 and 10.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

DETAILED DESCRIPTION

In the following detailed description, numerous specific details are set forth to provide a thorough understanding of embodiments of the present disclosure. However, it will be understood by those skilled in the art that the present disclosure may be practiced without these specific details. In some instances, well-known methods, procedures, components, and circuits have not been described in detail so as not to obscure the present disclosure. It is intended that all embodiments disclosed herein can be implemented separately or combined in any way and/or combination. Aspects described with respect to one embodiment may be incorporated in different embodiments although not specifically described relative thereto. That is, all embodiments and/or features of any embodiments can be combined in any way and/or combination.

Embodiments described herein provide devices, and methods for manufacturing such devices, that improve the performance of a gate trench semiconductor device. Embodiments described herein may provide an improved gate trench structure that incorporates a recess in the bottom surface of the gate trench, and a doped well adjacent thereto, to improve a blocking and/or conductivity performance of the device.

Figure 1A:
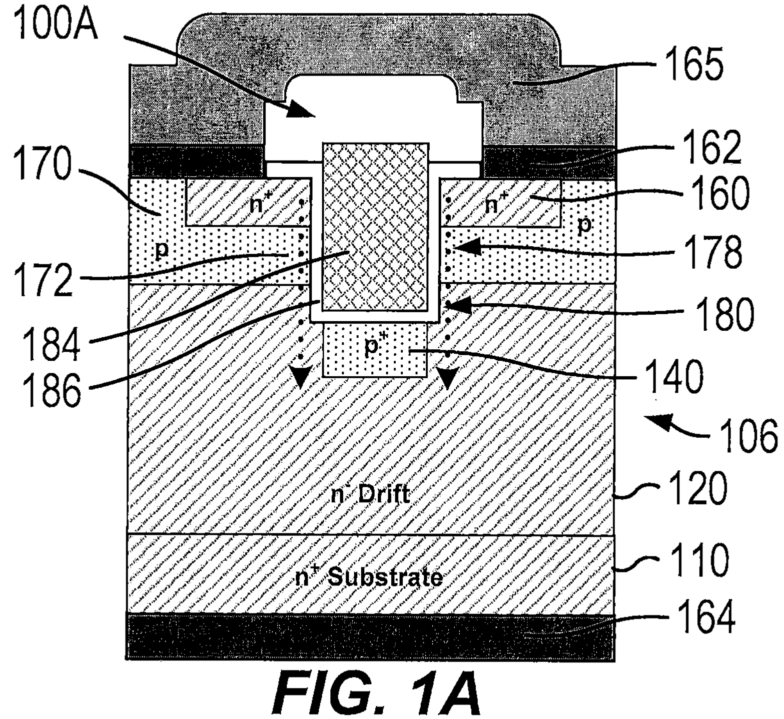
FIG. 1A (related art)
FIGS. 1A and 1B illustrate conventional mechanisms that are used to shield the gate oxide of a MOSFET device from electric field crowding.
Figure 1B:
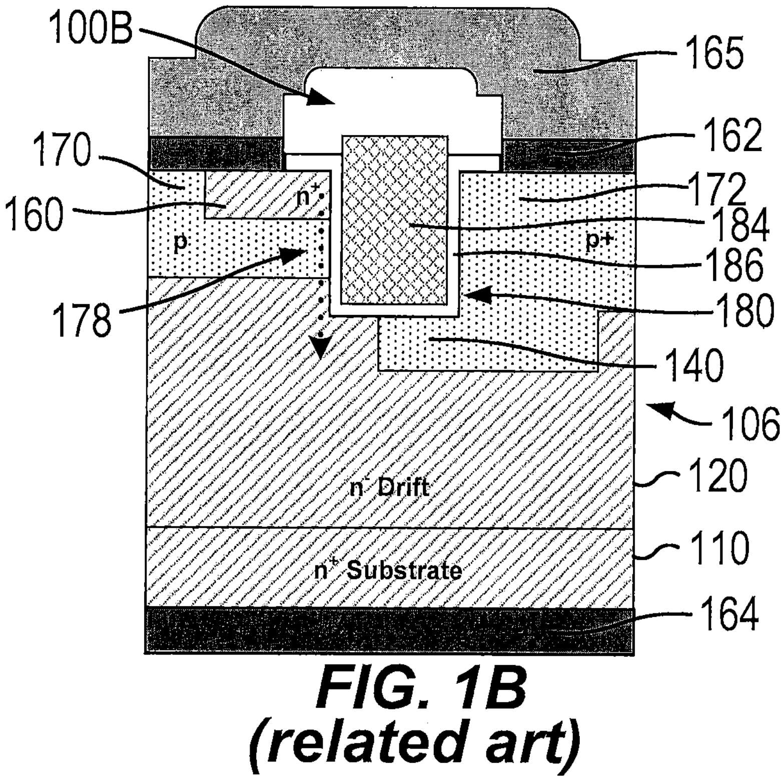
FIG. 1B (related art)

SiC gate trench MOSFET vertical power devices are attractive due to their inherent lower specific on-resistance, which may result in more efficient operation for power switching operations requiring low-to-moderate reverse blocking voltage levels (e.g., 650-1200V). Trench MOSFET vertical power devices may exhibit a lower specific resistance during on-state operation since the channel is formed on the sidewall of the gate trench, and the trench design reduces the overall pitch of the device, allowing for increased integration. Moreover, the carrier mobility in the sidewall channel of a trench MOSFET has been found to be 2-4 times higher than the corresponding carrier mobility in the channel of a planar (e.g., lateral structure) device. This increased carrier mobility also enhances the current density. However, SiC gate trench MOSFET vertical power devices may experience oxide reliability issues, due to the presence of sharp high electric field corners at bottom edges of the trench that can break down the gate oxide over time, eventually resulting in failure of the device. FIGS. 1A and 1B illustrate conventional mechanisms that are used to shield the gate oxide of a MOSFET device from electric field crowding.

FIG. 1A is a schematic cross-sectional diagram of a first wide band-gap power MOSFET 100A. The MOSFET 100A incorporates a bottom gate p+ shielding. As shown in FIG. 1A, the power MOSFET 100A includes a heavily-doped ($n^+$) n-type silicon carbide substrate 110. A lightly-doped ($n^-$) silicon carbide drift region 120 is provided on the substrate 110. A moderately-doped p-type silicon carbide well region 170 is formed on the upper surface of the n-type drift region 120. The moderately-doped p-type silicon carbide well region 170 may be formed, for example, by epitaxial growth. This moderately-doped p-type silicon carbide well region 170 may provide p-wells 172 for the device 100A. The transistor channels 178 may be formed in the p-wells 172, as will be discussed below. A heavily-doped $n^+$ silicon carbide source region 160 may be formed in an upper region of the p-type silicon carbide well region 170. The heavily-doped $n^+$ silicon carbide source region 160 may be formed for example, by ion implantation.

The substrate 110, drift region 120, the moderately doped p-type well region 170, and the heavily-doped $n^+$ silicon carbide source region 160, along with the various regions/patterns formed therein, comprise a semiconductor layer structure 106 of the MOSFET 100A.

Gate trenches 180 are formed in the semiconductor layer structure 106. The gate trenches 180 may extend through the heavily-doped $n^+$ silicon carbide source region 160 and the moderately-doped p-type well region 170 and into the drift region 120. A gate insulating layer 186 may be formed on the bottom surface and sidewalls of each gate trench 180. A gate electrode 184 may be formed on each gate insulating layer 186 to fill the respective gate trenches 180. Vertical channel regions 178 are provided in the p-wells 172 adjacent the gate insulating layer 186.

Source contacts 162 may be formed on the heavily-doped n-type source regions 160. A wiring layer 165 may connect various ones of the source contacts 162. A drain contact 164 may be formed on the lower surface of the substrate 110. A gate contact (not shown) may be formed on the gate electrode 184.

If the gate insulating layer 186, which is typically implemented as a silicon oxide layer, is subjected to overly high electric fields, the gate insulating layer 186 can degrade over time and eventually fail to insulate the gate electrode 184 from the semiconductor layer structure, which can result in device failure. The corners of the gate insulating layer 186 (e.g., the areas where the gate insulating layer 186 transition from vertical surfaces to lateral surfaces) are particularly susceptible to such high electric fields. To improve reliability of the gate insulating layer 186, the power MOSFET 100A includes a deep shielding pattern 140 under the gate trench 180. The deep shielding pattern 140 may be a heavily-doped ($p^+$) silicon carbide pattern that is formed in the upper surface of the n-type drift region 120 by ion implantation.

The deep shielding pattern 140 may be used to protect the corners of the gate insulating layer 186 from high electric fields during reverse blocking operation. The deep shielding pattern 140 may provide shielding for the gate insulating layer 186, and may provide additional device performance resulting from utilization of two sidewall faces for current conduction.

However, to block the electric fields the deep shielding pattern 140 should be electrically connected to the p-wells 172. In the MOSFET 100A of FIG. 1A, this electrical connection is typically provided outside the view of the cross-section, and may require significant extra processing steps. Moreover, in forming the device of FIG. 1A, it may be difficult to protect the sidewalls of the gate trench 180 during the formation of the deep shielding pattern 140 due to lateral "straggle" of p-type ions that bounce off the bottom surface of the gate trench 180 and implant into the sidewalls. As a result, sidewalls of the gate trench 180 may be damaged due to ion implantation. Additionally, since the portions of the n-type drift region 120 that form the lower sidewalls of the gate trench 180 are only lightly doped, and the p-type deep shielding pattern is heavily doped, if a sufficiently large number of p-type ions are implanted into the lower sidewalls of the gate trench 180, the n-type regions that are below the channels 178 may be converted to p-type material. If this occurs, the device 100A may be rendered inoperable.

FIG. 1B is a schematic cross-sectional diagram of a second wide band-gap power MOSFET 100B. The MOSFET 100B incorporates an asymmetric p+ shielding. In FIG. 1B, a description of structures that are similar to those described with respect to FIG. 1A will not be repeated for brevity. As shown in FIG. 1B, the power MOSFET 100B incorporates an electrical connection between the p-well 172 and the deep shielding pattern 140 along one sidewall of each gate trench 180. For example, a p-type material of the MOSFET 100B may continuously extend from the deep shielding pattern 140 beneath the gate trench 180, along one sidewall of the gate trench 180, and to the p-well 172. The electrical connection between the p-well 172 and the deep shielding pattern 140 may provide a robust protection for the right-side corners of the gate trenches 180. However, as can be seen in FIG. 1B, the deep shielding pattern 140 and/or the p-well 172 cover one side of the gate trench 180, which removes a channel from that side of the gate trench 180. As a result, in the embodiment illustrated in FIG. 1B, only one channel 178 (the left side of the gate trench 180 in FIG. 1B) may be available during on-state operation of the device.

The present disclosure provides embodiments that represent improvements over the techniques described with respect to FIGS. 1A and 1B. The present disclosure provides a semiconductor device having a gate trench incorporating dual trenches, which may provide a recess at the bottom of the gate trench. The use of the dual trenches allows for finer control of the placement of the deep shielding pattern and increased protection of the device during reverse blocking operation.

Figure 2A:
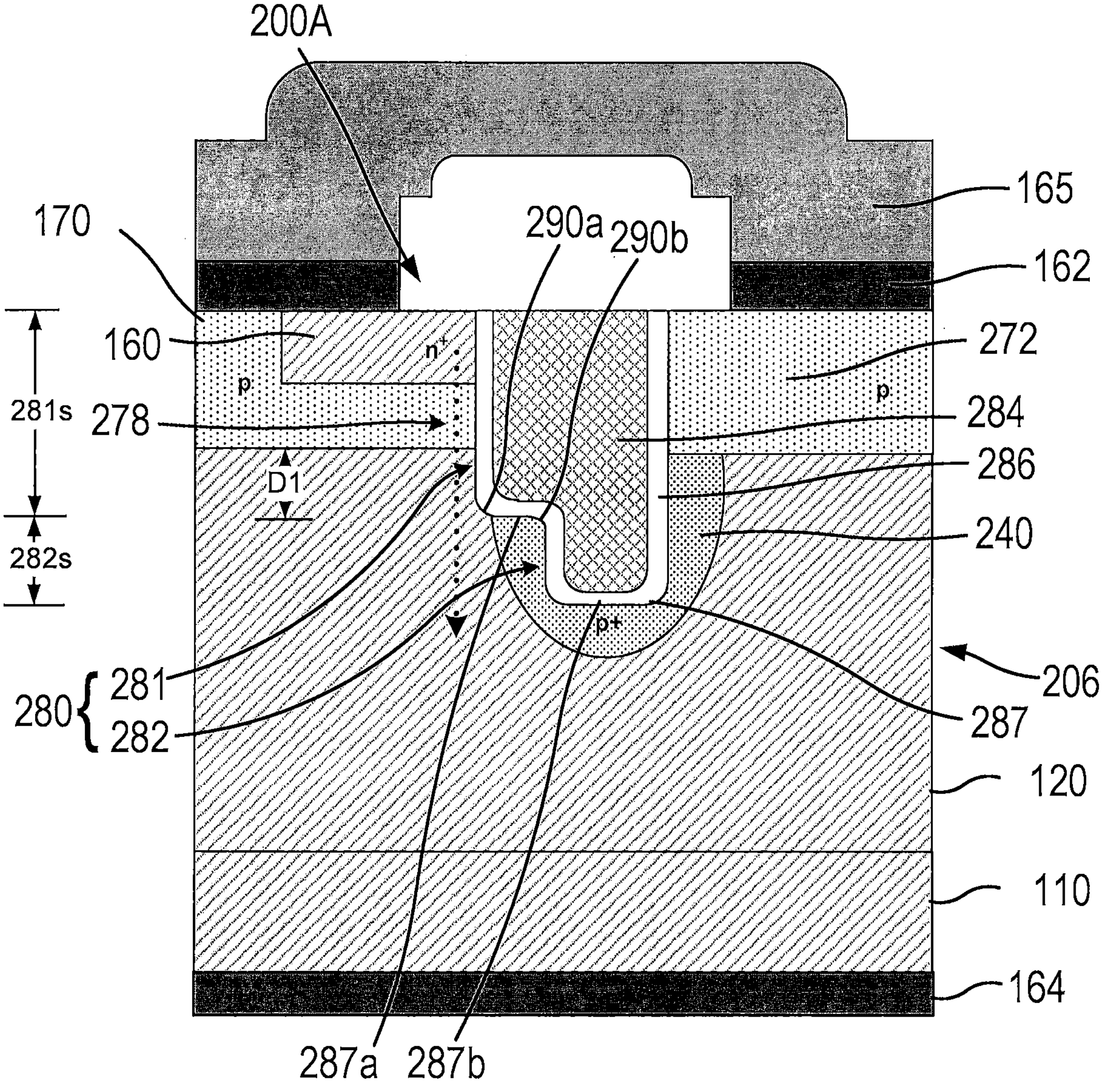
FIGS. 2A and 2B are schematic cross-sectional diagrams of MOSFET devices according to some embodiments of the present disclosure.
Figure 2B:
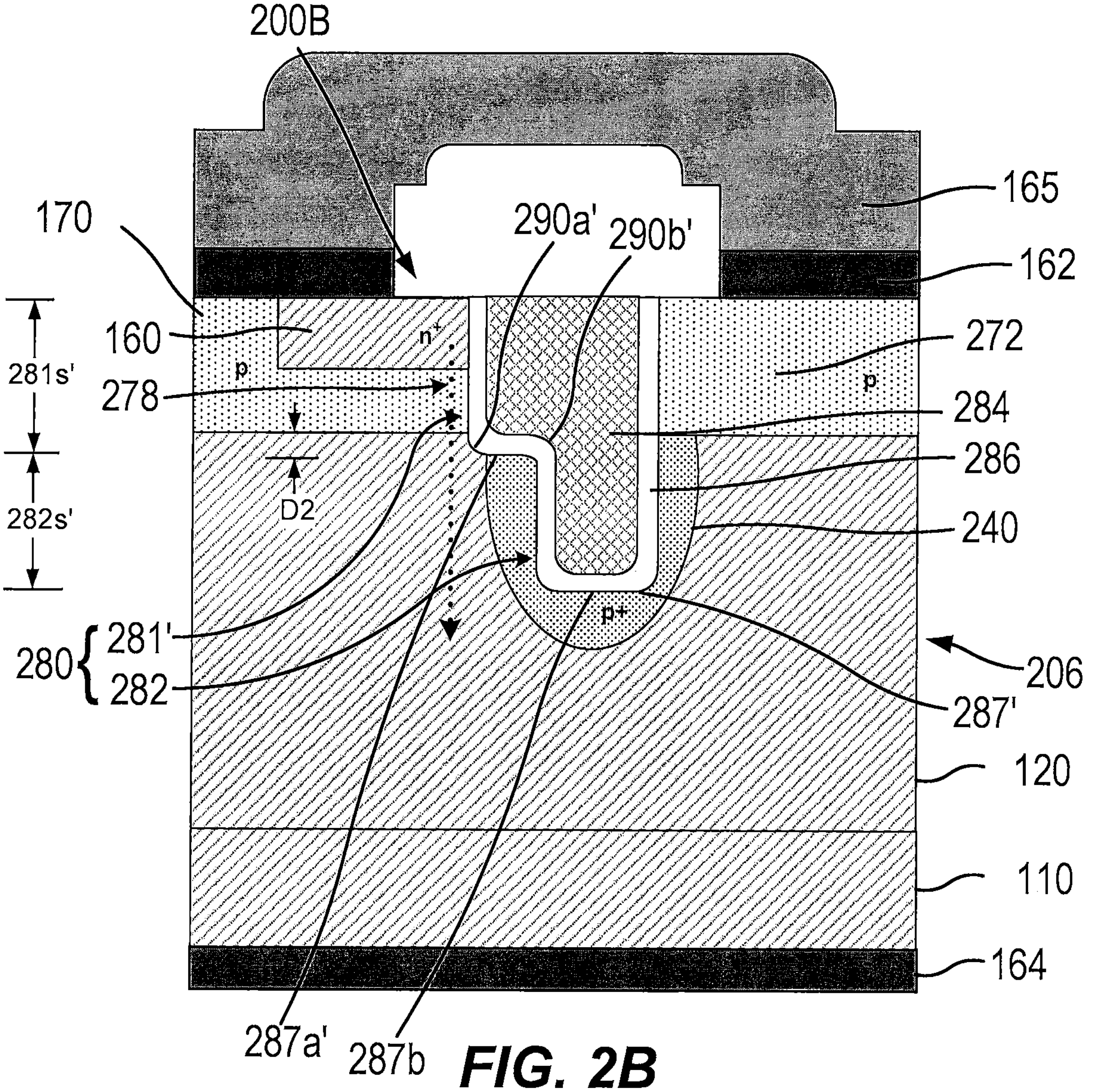

FIGS. 2A and 2B are schematic cross-sectional diagrams of MOSFET devices 200A, 200B according to some embodiments of the present disclosure. Referring to FIG. 2A, the power MOSFET 200A may include an n-type wide band-gap semiconductor substrate 110. The substrate 110 may comprise, for example, a 4H-SiC or 6H-SiC substrate. In other embodiments, the substrate 110 may be or comprise a different semiconductor material (e.g., a Group III nitride-based material, Si, GaAs, ZnO, InP) or a non-semiconductor material (e.g., sapphire). The substrate 110 may be heavily-doped with n-type impurities (i.e., an $n^+$ silicon carbide substrate). The impurities may comprise, for example, nitrogen or phosphorous. The doping concentration of the substrate 110 may be, for example, between $1\times10^{18}$ atoms/$cm^3$ and $1\times10^{21}$ atoms/$cm^3$, although other doping concentrations may be used. The substrate may be relatively thick in some embodiments (e.g., 20-100 microns or more), but is shown as a thin layer in FIGS. 2A and 2B (and other figures) to allow enlargement of other layers and regions of the device.

A lightly-doped n-type (n−) drift region 120 (e.g., silicon carbide) may be provided on the substrate 110. The n-type drift region 120 may be formed by, for example, epitaxial growth on the substrate 110. The n-type drift region 120 may have, for example, a doping concentration of $1\times10^{16}$ to $5\times10^{17}$ dopants/$cm^3$. The n-type drift region 120 may be a thick region, having a vertical height above the substrate 110 of, for example, 3-100 microns. In some embodiments, an upper portion of the n-type drift region 120 may comprise an n-type current spreading layer (not shown) that is more heavily doped than the lower portion of the n-type drift region 120.

A moderately-doped p-type well region 170 (e.g., silicon carbide) may be formed on the upper surface of the n-type drift region 120. The moderately-doped p-type well region 170 may be formed, for example, by epitaxial growth. This moderately-doped p-type well region 170 may provide p-wells 272 for the device 200A. In some embodiments, the p-wells 272 may have a doping concentration of, for example, between $5\times10^{16}/cm^3$ and $5\times10^{19}/cm^3$. The transistor channels 278 may be formed in the p-wells 272, as will be discussed below.

A heavily-doped $n^+$ source region 160 (e.g., silicon carbide) may be formed in an upper region of the p-type well region 170. The heavily-doped $n^+$ source region 160 may be formed, for example, by ion implantation.

The substrate 110, drift region 120, the moderately doped p-type well region 170, and the heavily-doped $n^+$ source region 160, along with the various regions/patterns formed therein, comprise a semiconductor layer structure 206 of the MOSFET 200A. Herein, the term "semiconductor layer structure" refers to a structure that includes one or more semiconductor layers, for example, semiconductor substrates and/or semiconductor epitaxial layers.

Gate trench 280 may be formed in the semiconductor layer structure 206. The gate trench 280 may extend through the heavily-doped $n^+$ source region 160 and the moderately-doped p-type well region 170 and into the drift region 120. The gate trench 280 may include a first trench 281 (also referred to as a first gate trench) and a second trench 282 (also referred to as a second gate trench). A depth of the first trench 281 may be shallower than the second trench 282. In some embodiments, the second trench 282 is connected to the first trench 281. For example, in some embodiments, a sidewall of the second trench 282 may connect to a bottom or a sidewall of the first trench 281. In some embodiments, the second trench 282 may be located at one side of the first trench 281. In FIG. 2A, the second trench 282 is located at the right side of the first trench 281, but it will be understood that the present disclosure is not limited thereto.

The configuration of the first trench 281 and the second trench 282 may result in a gate trench having a non-linear bottom surface 287. The bottom surface 287 may have a first portion 287*a* at a first level and a second portion 287*b* at a second level that is different from the first level. In some embodiments, the second level of the second portion 287*b* may be deeper (e.g., closer to the substrate 110) than the first level of the first portion 287*a*. In some embodiments, the difference between the first level of the first trench 281 and the second level of the second trench 282 may be from 0.1-40 μm. In some embodiments, the difference between the first level of the first trench 281 and the second level of the second trench 282 may be from 0.5-20 μm. In some embodiments, the difference between the first level of the first trench 281 and the second level of the second trench 282 may be from 1-10 μm. The first portion 287*a* and the second portion 287*b* may both be relatively flat. As a result, the gate trench 280 may have more than two bottom corners.

The first portion 287*a* of the bottom surface 287 may correspond to a bottom surface of the first trench 281 and the second portion 287*b* of the bottom surface 287 may correspond to a bottom surface of the second trench 282. The first level of the first portion 287*a* of the bottom surface 287 may be a first distance D1 from the bottom of the p-well 272. In other words, the first portion 287*a* of the bottom surface 287 may extend into the drift region 120 by a first distance D1 farther than the p-well 272. The distance D1 may depend on a pitch of the unit cells of the device. In some embodiments, the distance D1 may be from greater than 0.1 μm to 5 μm, though the present disclosure is not limited thereto. The first and second levels of the bottom surface 287 may result in a recess within the bottom surface 287 of the gate trench 280 that protrudes towards the substrate 110.

A deep shielding pattern 240 may be formed on the bottom surface 287 of the gate trench 280. The deep shielding pattern 240 may be a heavily-doped ($p^+$) pattern (e.g., silicon carbide) that is formed in the upper surface of the n-type drift region 120 by ion implantation. In some embodiments, the deep shielding pattern 240 may have a doping concentration of, for example, between $1\times10^{17}/cm^3$ and $1\times10^{21}/cm^3$. In some embodiments, the deep shielding pattern 240 may be on the first portion 287*a* and/or second portion 287*b* of the bottom surface 287 of the gate trench 280. In some embodiments, the deep shielding pattern 240 may extend along the entire bottom surface 287*b* of the second trench 282. In some embodiments, the deep shielding pattern 240 may be between the bottom surface 287*b* and sidewalls of the second trench 282 and the drift region 120. In some embodiments, the deep shielding pattern 240 may not cover all of the sidewalls or bottom surfaces of the first trench 281. That is to say that portions of the first trench 281 may directly abut the drift region 120 without a portion of the deep shielding pattern 240 thereon.

The use of the first trench 281 and the second trench 282 results in the formation of two corners 290*a*, 290*b* of the first gate trench 281. The first corner 290*a* may be a corner between the bottom surface of the first trench 281 (e.g., first portion 287*a*) and a sidewall of the first trench 281. The second corner 290*b* may be a corner between the bottom surface of the first trench 281 (e.g., first portion 287*a*) and a sidewall of the second trench 282. In some embodiments, a radius of curvature of the second corner 290*b* may be greater than a radius of curvature of the first corner 290*a*. In some embodiments, at least a portion of the first corner 290*a* may abut the drift region 120 without a portion of the deep shielding pattern 240 thereon. In some embodiments, the deep shielding pattern 240 may be on, and in some embodiments cover, the second corner 290*b*.

The deep shielding pattern 240 may extend along a sidewall of the second trench 282 to connect physically and/or electrically with the p-well 272. The connection between the deep shielding pattern 240 and the p-well 272 may provide for improved protection for one sidewall of the gate trench 280. The opposite sidewall of the gate trench 280 may form a channel 278 for the MOSFET 200A. As with the device of FIG. 1B, the MOSFET 200A may have one channel conducting on one side of the gate trench 280 during operation. In contrast to the embodiments of FIG. 1B, however, the use of the first and second trenches 281, 282 in the MOSFET 200A may allow for improved protection for the first corner 290*a* of the gate trench 280. In the MOSFET 200A, the deep shielding pattern 240 is formed deeper (e.g., nearer the substrate 110) than in a related device (such as the MOSFET 100B of FIG. 1B). Having the deep shielding pattern 240 deeper in the drift region 120 provides better protection from the electrical field that is generated in the drift region 120 during reverse blocking operations for the first corner 290*a*. The use of the deeper second trench 282 allows for the deep shielding pattern 240 to be formed without excessive implant energy.

The formation of the first gate trench 281 and the second gate trench 282 may result in the formation of a first sidewall of the first gate trench 281 having a first depth 281*s* and a second sidewall of the second gate trench 282 having a second depth 282*s*. The first depth of the first sidewall 281*s* may be a depth (e.g., a dimension in a direction perpendicular to a top surface of the substrate) of a portion of a sidewall of the first gate trench 281 that extends from a top surface of the semiconductor layer structure 206 to the first corner 290*a*. The second depth of the second sidewall 282*s* may be a depth of a portion of a sidewall of the second gate trench 282 that extends from the second corner 290*b* to a bottom surface of the second gate trench 282. In some embodiments, a ratio of the depth of the first sidewall 281*s* to the second sidewall 282*s* (e.g., 281*s*/282*s*) may be one or greater. In some embodiments, the ratio of the depth of the first sidewall 281*s* to the second sidewall 282*s* may be between 1 and 20. In some embodiments, the ratio of the depth of the first sidewall 281*s* to the second sidewall 282*s* may be between 1 and 10. In some embodiment the ratio of the depth of the first sidewall 281*s* to the second sidewall 282*s* may be between 1 and 5. In some embodiment the ratio of the depth of the first sidewall 281*s* to the second sidewall 282*s* may be between 2 and 10. The first depth of the first sidewall 281*s* may also represent a distance between the top surface of the semiconductor layer structure 206 and the first portion 287*a* of the bottom surface 287 of the gate trench 280. The second depth of the second sidewall 282*s* may also represent a distance between the first portion 287*a* and the second portion 287*b* of the bottom surface 287 of the gate trench 280.

Referring back to FIG. 2A, gate insulating layer 286 may be formed on the bottom surface and sidewalls of the gate trench 280, including the first trench 281 and the second trench 282. A gate electrode 284 may be formed on the gate insulating layer 286 to be within and/or fill the gate trench 280.

Source contacts 162 may be formed on the heavily-doped n-type source regions 160. A wiring layer 165 may connect various ones of the source contacts 162. A drain contact 164 may be formed on the lower surface of the substrate 110. A gate contact (not shown) may be formed on the gate electrode 284.

Though FIG. 2A illustrates a first trench 281 that is separated from the p-well 272 by a first distance D1, it will be understood that the present disclosure is not limited thereto. In some embodiments, the distance between the p-well 272 and the bottom surface 287*a* of the first trench 281 may be varied. For example, FIG. 2B illustrates an example embodiment of a MOSFET 200B of the present disclosure in which first trench 281 is separated from the p-well 272 by a second distance D2, where the second distance D2 is smaller than the first distance D1. In some embodiments, the distance D2 may be from 0.1 μm to less than 5 μm, though the present disclosure is not limited thereto. Elements of FIG. 2B that are substantially similar to those of FIG. 2A will not be described for brevity.

Referring to FIG. 2B, a depth of a first trench 281' may be made shallower than the embodiment illustrated in FIG. 2A. For example, the first portion 287*a*' of the bottom surface 287' of the gate trench 280 may be formed closer to the surface of the semiconductor layer structure 206. As a result, a distance between the first portion 287*a*' and the second portion 287*b* of the bottom surface 287' may increase. The shallower first trench 281' may result in the first corner 290*a*' and/or the second corner 290*b*' being placed closer to the p-well 272. The embodiment of FIG. 2B may result in better protection for the first corner 290*a*' during reverse blocking, while the embodiment of FIG. 2A may provide a JFET region with a larger width so that current flow is improved over the embodiment of FIG. 2B.

Still referring to FIG. 2B, the formation of the first gate trench 281' and the second gate trench 282 may result in the formation of a first sidewall of the first gate trench 281' having a first depth 281*s*' and a second sidewall of the second gate trench 282 having a second depth 282*s*'. The first depth of the first sidewall 281*s*' may be a depth of a portion of a sidewall of the first gate trench 281' that extends from a top surface of the semiconductor layer structure 206 to the first corner 290*a*'. The second depth of the second sidewall 282*s*' may be a depth of a portion of a sidewall of the second gate trench 282 that extends from the second corner 290*b*' to a bottom surface of the second gate trench 282. In some embodiments, a ratio of the depth of the first sidewall 281*s*' to the second sidewall 282*s*' (e.g., 281*s*/282*s*') may be one or less. In some embodiments, the ratio of the depth of the first sidewall 281*s*' to the second sidewall 282*s*' may be between 0.1 and 1. In some embodiments, the ratio of the depth of the first sidewall 281*s*' to the second sidewall 282*s*' may be between 0.05 and 1. In some embodiments, the ratio of the depth of the first sidewall 281*s*' to the second sidewall 282*s*' may be between 0.2 and 1. In some embodiments, the ratio of the depth of the first sidewall 281*s*' to the second sidewall 282*s*' may be between 0.1 and 0.5. The first depth of the first sidewall 281*s*' may also represent a distance between the top surface of the semiconductor layer structure 206 and the first portion 287$a'$ of the bottom surface 287' of the gate trench 280. The second depth of the second sidewall 282$s'$ may also represent a distance between the first portion 287$a'$ and the second portion 287$b$ of the bottom surface 287' of the gate trench 280.

FIGS. 3A to 3H are schematic cross-sectional views illustrating methods of manufacturing the power switching devices 200A, 200B of FIGS. 2A and 2B according to some embodiments of the present disclosure.

A description of those elements of FIGS. 3A to 3H that are the same or similar to those of FIGS. 2A and 2B will be omitted for brevity. Accordingly, the description of FIGS. 3A to 3H will focus on differences with the figures previously described.

Figure 3A:
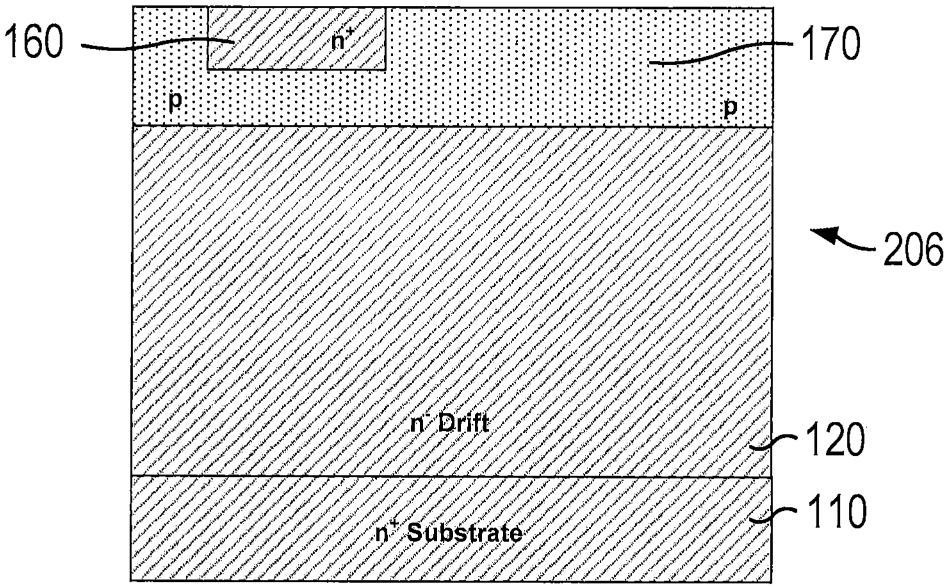
FIGS. 3A to 3H are schematic cross-sectional views illustrating methods of manufacturing the power switching devices of FIGS. 2A and 2B according to some embodiments of the present disclosure.

Referring to FIG. 3A, a substrate 110 is provided and a drift region 120 is formed on the substrate 110 via epitaxial growth. In some embodiments, the substrate 110 is a heavily-doped ($n^+$) n-type silicon carbide and the drift region 120 is a lightly-doped ($n^-$) silicon carbide drift region 120. In some embodiments, an n-type silicon carbide current spreading layer may be formed that comprises the upper portion of the drift region 120.

A moderately-doped p-type well region 170 (e.g., silicon carbide) may be formed on the upper surface of the n-type drift region 120 and a heavily-doped ($n^+$) n-type source region 160 (e.g., silicon carbide) may be formed in an upper portion of the p-type well region 170. In some embodiments, the p-type well region 170 may be formed by epitaxial growth. In some embodiments, the p-type well region 170 may be formed by ion implantation. In some embodiments, a doping concentration of the p-type well region 170 may be non-uniform. For example, in some embodiments, upper portions of the p-type well region 170 may have a higher doping concentration than lower portions of the p-type well region 170. In some embodiments, ion implantation may be used to form the source region 160 in the p-type well region 170. The n-type source region 160, the p-type well region 170, drift region 120, and substrate 110 may form semiconductor layer structure 206.

Figure 3B:
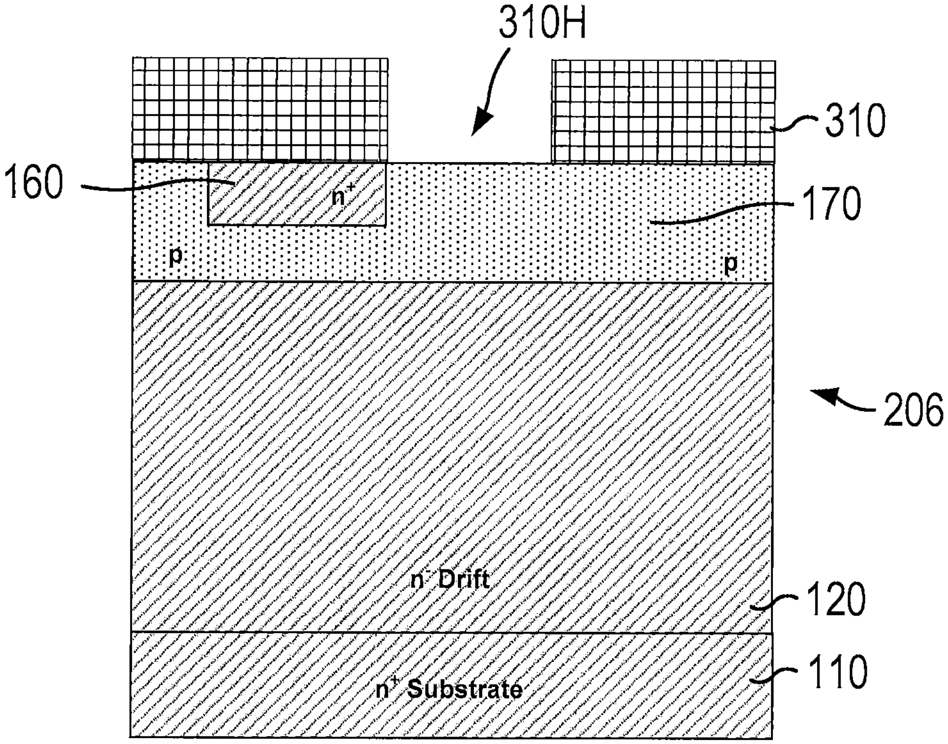

Referring to FIG. 3B, a first mask 310 may be formed on an upper surface of the semiconductor layer structure 206. The first mask 310 may have a hole 310H that exposes an upper surface of the p-type well region 170 that is adjacent the n-type source region 160.

Figure 3C:
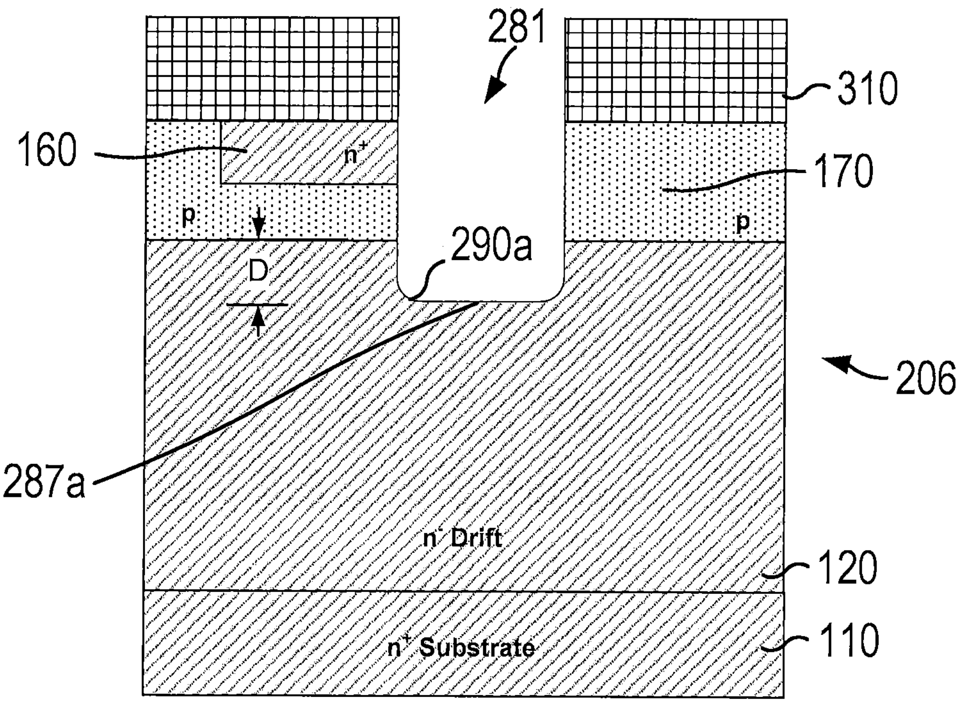

Referring to FIG. 3C, an etching process may be performed through the hole 310H in the first mask 310. The etching process may be an anisotropic etch that removes portions of the p-type well region 170 and the drift region 120 to form the first trench 281. A bottom surface 287$a$ of the first trench 281 may be formed at a first level in the drift region 120. The etching process may be configured to control the depth D from a lower surface of the p-type well region 170 to which a bottom surface 287$a$ of the first trench 281 is formed. In some embodiments, the depth D may be configured to be similar to the first depth D1 illustrated in FIG. 2A. In some embodiments, the depth D may be configured to be similar to the second depth D2 illustrated in FIG. 2B. That is to say that the height of the first corner 290$a$, 290$a'$ (see FIGS. 2A and 2B) above the substrate 110 may be controlled by controlling the depth D of the etching of the first trench 281.

Figure 3D:
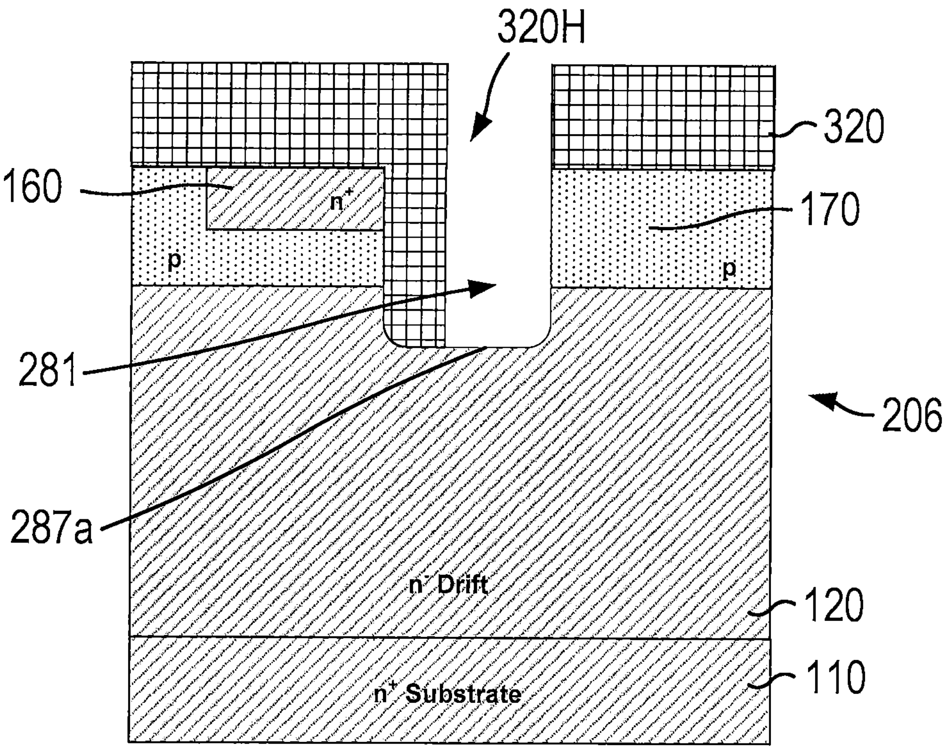

Referring to FIG. 3D, a second mask 320 may be formed on an upper surface of the semiconductor layer structure 206 and within the first trench 281. The second mask 320 may have a hole 320H that exposes a portion of the bottom surface of the first trench 281. The second mask 320 may cover a first sidewall of the first trench 281 while exposing a second sidewall of the first trench 281. In some embodiments, the second mask 320 may be formed after removing the first mask 310. In some embodiments, the second mask 320 may be formed by adding additional mask structures to the first mask 310.

Figure 3E:
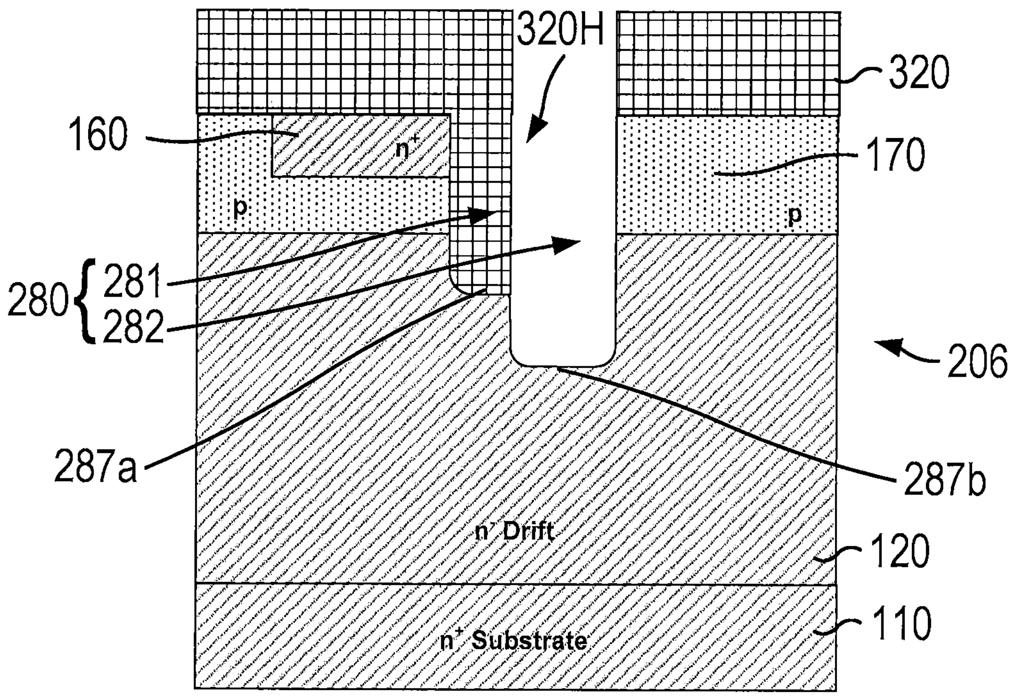

Referring to FIG. 3E, an etching process may be performed through the hole 320H in the second mask 320. The etching process may be an anisotropic etch that removes portions of the p-type well region 170 and/or the drift region 120 to form the second trench 282. The etching process may be configured to control a second level at which a bottom surface 287$b$ of the second trench 282 is formed. The bottom surface 287$b$ of the second trench 282 may be deeper than the first level of the bottom surface 287$a$ of the first trench 281. In some embodiments, the second trench 282 is connected to the first trench 281. For example, in some embodiments, a sidewall of the second trench 282 may connect to a bottom or a sidewall of the first trench 281. In some embodiments, the second trench 282 may be located at one side of the first trench 281. In FIG. 3E, the second trench 282 is located at the right side of the first trench 281, but it will be understood that the present disclosure is not limited thereto. The first trench 281 and the second trench 282 may form the gate trench 280.

Figure 3F:
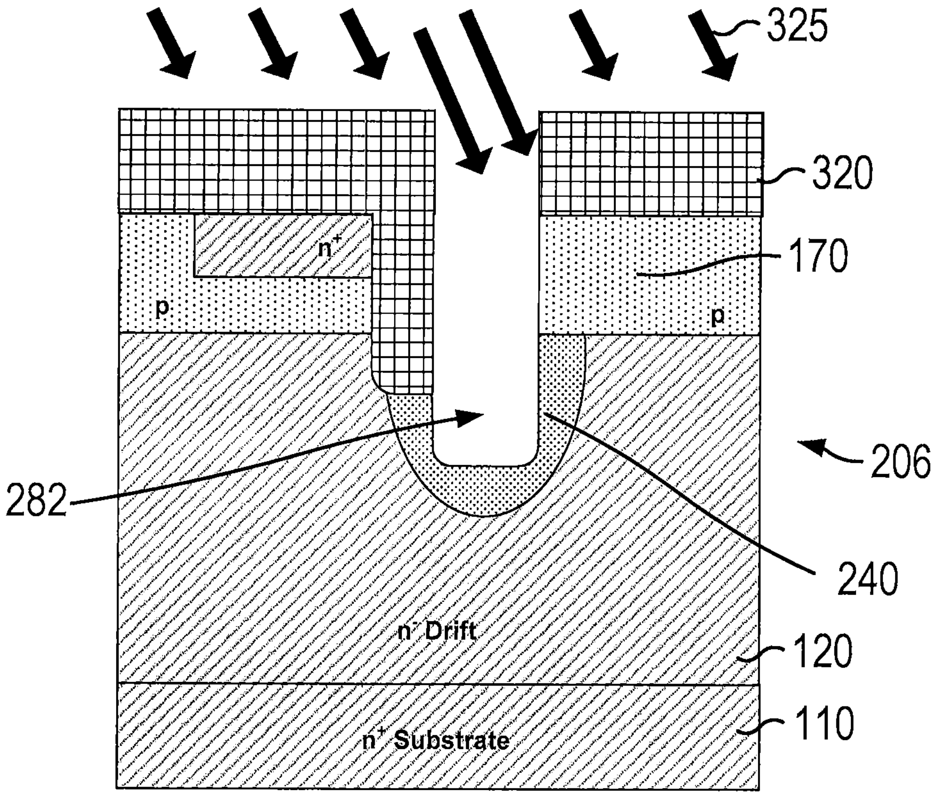

Referring to FIG. 3F, an ion implantation process 325 may be performed to form the p+ deep shielding pattern 240. In some embodiments, the ion implantation process 325 may include one or more angled ion implantation processes. In the figure, the ion implantation process is shown as being angled to implant the right sidewall of the gate trench 280. An additional "straight" (i.e., perpendicular to the substrate) ion implantation process may be performed and/or an additional angled ion implantation process may optionally be performed that implants ions into the left sidewall. Note that in some embodiments, the left sidewall of the gate trench 280 may be implanted by ions that reflect off the bottom surface and right sidewall of the gate trench 280 so that an angled ion implant is not necessary to implant the left sidewall of the gate trench 280. The ion implantation process 325 may result in a relatively deep ion implantation in the second trench 282. The ion implantation process 325 may result in the formation of the deep shielding pattern 240 on portions of the sidewalls and bottom surface of the second trench 282. In some embodiments, additional p-type ions may be implanted in portions of the p-type well region 170. Because of the second mask 320, at least one sidewall of the first trench 281 may be protected from the ion implantation. For example, the sidewall of the first trench 281 adjacent the n-type source region 160 may not be implanted by the ion implantation process 325. This may ensure that the portion of the n-type drift region 120 that is below the p-well 272 on the left side of the gate trench 280 is not implanted with p-type ions.

In some embodiments, a spacer dielectric such as, for example, silicon oxide or silicon nitride, may be deposited within the second trench 282 prior to performing the ion implantation process 325. The addition of the spacer dielectric may allow for the adjustment of the implantation depth and allow for more precise control of lateral straggle of the implanted ions. In some embodiments, the ion implantation process may be followed by activation of the implanted ions.

Figure 3G:
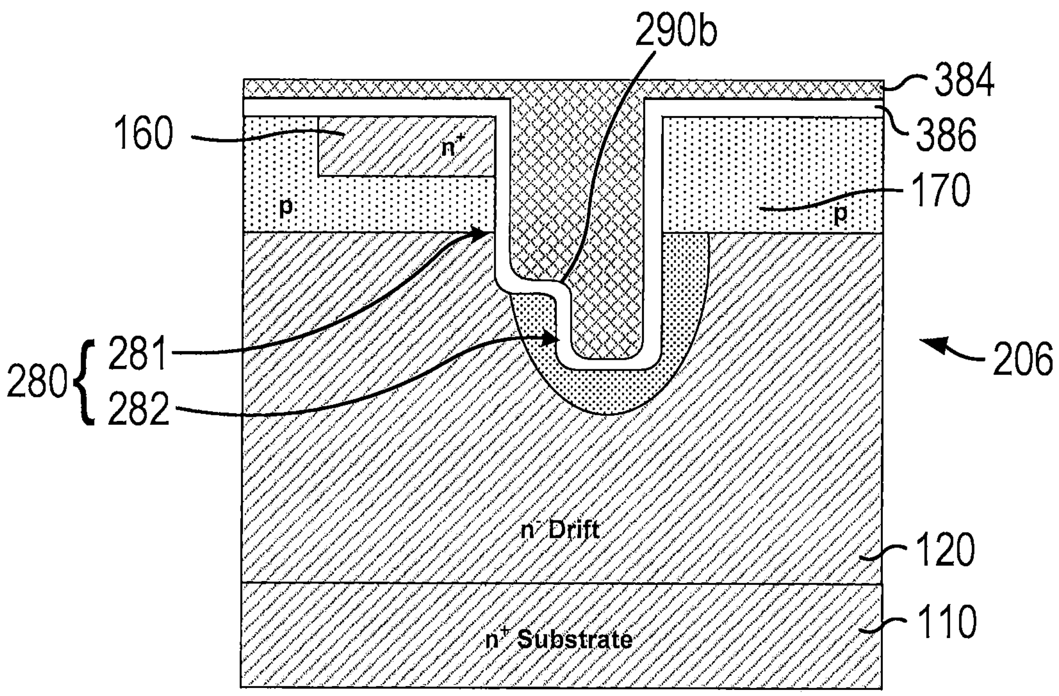

Referring to FIG. 3G, the second mask 320 may be removed and a gate insulating layer 386 may be formed on the upper surface of the semiconductor layer structure 206 and in the gate trenches 280 (including the first trench 281 and the second trench 282). The gate insulating layer 386 may comprise, for example, a silicon dioxide ($SiO_2$) layer, although other insulating materials, such as $SiO_xN_y$, $Si_xN_y$, $Al_2O_3$ and/or high-K dielectrics such as hafnium oxide, and the like may be used.

In some embodiments, prior to forming the gate insulating layer 386, additional processing (e.g., etching and/or oxidation) may be performed on the second corner 290*b*, 290*b*' (see FIGS. 2A and 2B) that is formed at the interface between the first trench 281 and the second trench 282. The additional processing may be performed to increase a radius of curvature of the second corner 290*b*, 290*b*'. By increasing the radius of curvature (e.g., making the second corner 290*b*, 290*b*' less sharp), the corner may be better protected from electric field crowding. Additional processing to alter the second corner 290*b*, 290*b*' is optional, however. In some embodiments, the etching of the second trench 282 after the formation of the first trench 281 may naturally increase the radius of curvature of the second corner 290*b*, 290*b*'.

An electrode layer 384 may be formed on the gate insulating layer 386. The electrode layer 384 may also be formed within, and in some embodiments fill, the gate trench 280 (including the first trench 281 and the second trench 282). The electrode layer 384 may include, for example, a silicide, doped polycrystalline silicon (poly-Si or poly), and/or a stable conductor.

Figure 3H:
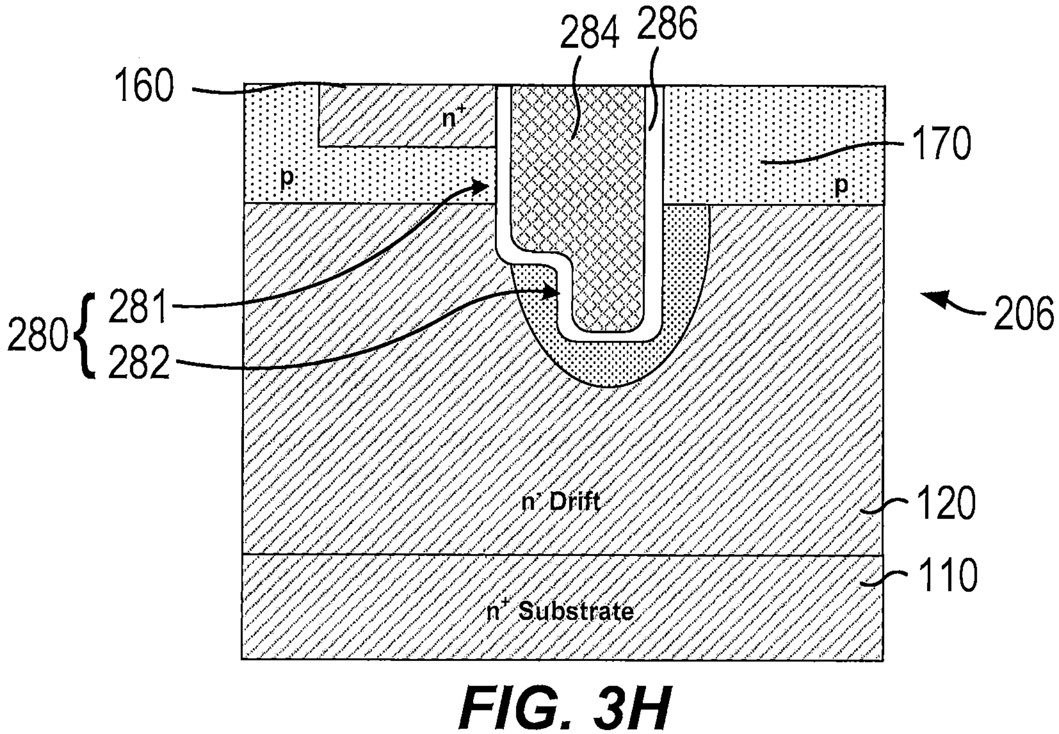

Referring to FIG. 3H, the electrode layer 384 and the gate insulating layer 386 may be etched to form the gate electrode 284 and the gate insulating layer 286. In some embodiments, an upper surface of the gate electrode 284 and the gate insulating layer 286 may be formed to be coplanar with an upper surface of the semiconductor layer structure 206, but the embodiments of the present disclosure are not limited thereto. In some embodiments, at least a portion of the gate insulating layer 286 may extend on the upper surface of the semiconductor layer structure 206. In some embodiments, a level of an upper surface of the gate electrode 284 may be above a level of the upper surface of the semiconductor layer structure 206.

Referring back to FIGS. 2A and 2B, source contacts 162 may be formed on the heavily-doped n-type source regions 160. A wiring layer 165 may be formed to connect various ones of the source contacts 162. A drain contact 164 may be formed on the lower surface of the substrate 110. A gate contact (not shown) may be formed on the gate electrode 284.

In FIGS. 3A to 3H, the first trench 281 was formed before the second trench 282, but the embodiments of the present disclosure are not limited thereto. In some embodiments, the second trench 282 may be formed before the first trench 281.

FIGS. 4A to 4D are schematic cross-sectional views illustrating methods of manufacturing the power switching devices 200A, 200B of FIGS. 2A and 2B according to some embodiments of the present disclosure. A description of those elements of FIGS. 4A to 4D that are the same or similar to those figures previously described will be omitted for brevity. Accordingly, the description of FIGS. 4A to 4D will focus on differences with the figures previously described.

Figure 4A:
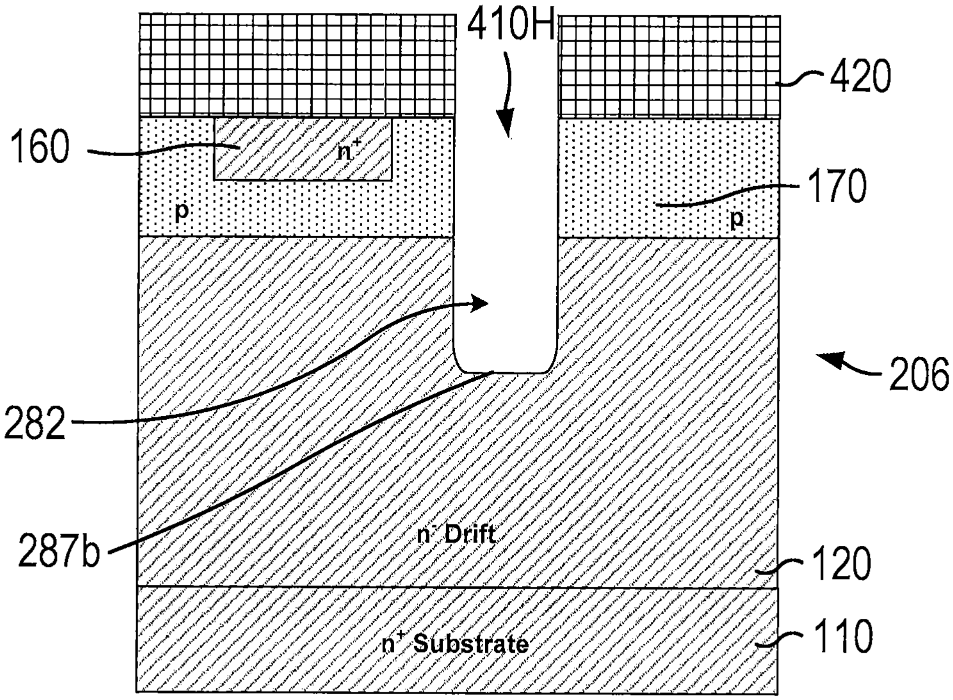
FIGS. 4A to 4D are schematic cross-sectional views illustrating methods of manufacturing the power switching devices of FIGS. 2A and 2B according to some embodiments of the present disclosure.

FIG. 4A illustrates a step of the process after the formation of the semiconductor layer structure 206 described with respect to FIG. 3A. Referring to FIG. 4A, a first mask 410 may be formed on an upper surface of the semiconductor layer structure 206. The first mask 410 may have a hole 410H that exposes an upper surface of the p-type well region 170. In some embodiments, the hole 410H exposes an upper surface of the p-type well region 170 that is remote from the n-type source region 160. An etching process may be performed through the hole 410H in the first mask 410. The etching process may be an anisotropic etch that removes portions of the p-type well region 170 and the drift region 120 to form the second trench 282. A bottom surface 287*b* of the second trench 282 may be formed at a second level in the drift region 120.

Figure 4B:
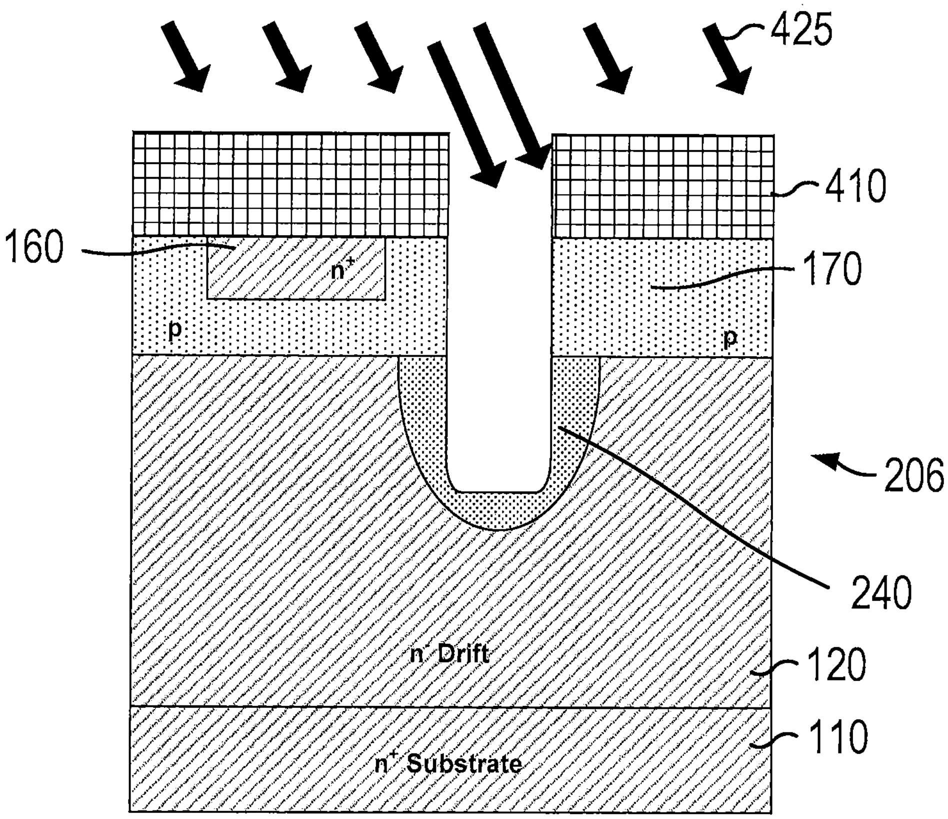

Referring to FIG. 4B, an ion implantation process 425 may be performed to form the p+ deep shielding pattern 240. In some embodiments, the ion implantation process 425 may include one or more angled and/or straight ion implantation processes as discussed above. The ion implantation process 425 may result in a relatively deep ion implantation in the second trench 282. The ion implantation process 425 may result in the formation of the deep shielding pattern 240 on portions of the sidewalls and bottom surface of the second trench 282. In some embodiments, additional p-type ions may be implanted in portions of the p-type well region 170.

In some embodiments, a spacer dielectric such as, for example, silicon oxide or silicon nitride, may be deposited within the second trench 282 prior to performing the ion implantation process 425. The addition of the spacer dielectric may allow for the adjustment of the implantation depth and allow for more precise control of lateral straggle of the implanted ions.

Figure 4C:
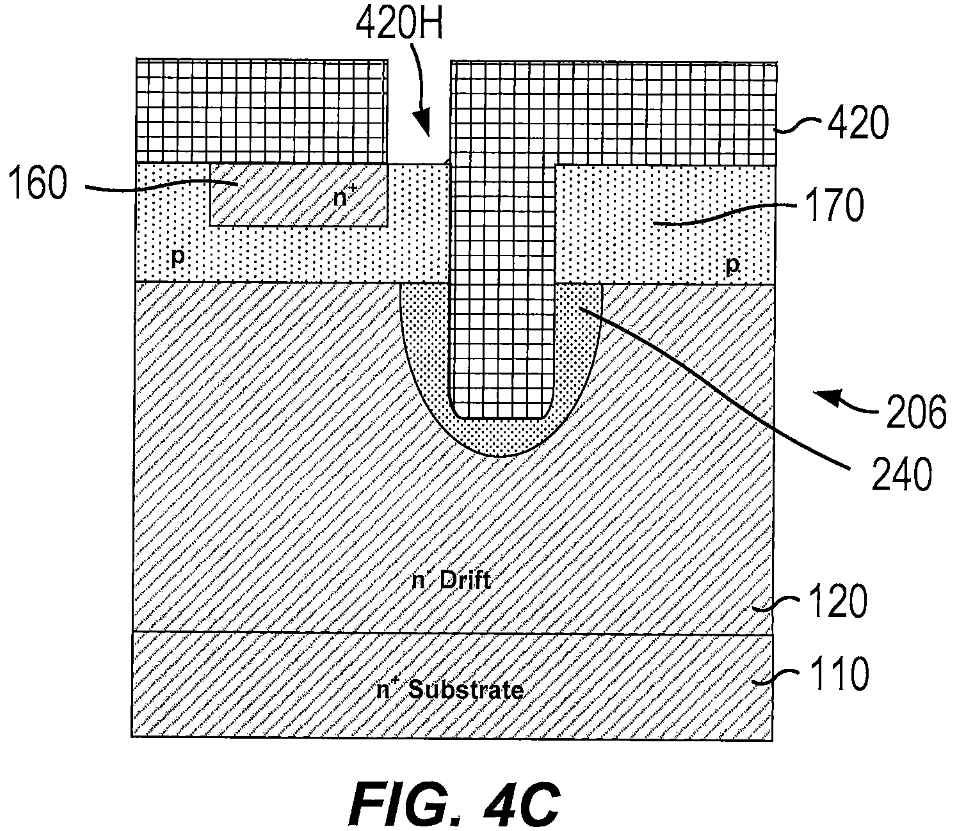

Referring to FIG. 4C, a second mask 420 may be formed on an upper surface of the semiconductor layer structure 206 and within the second trench 282. The second mask 420 may have a hole 420H that exposes an upper surface of the p-type well region 170 that is adjacent the n-type source region 160. In some embodiments, the second mask 420 may completely fill the second trench 282.

Figure 4D:
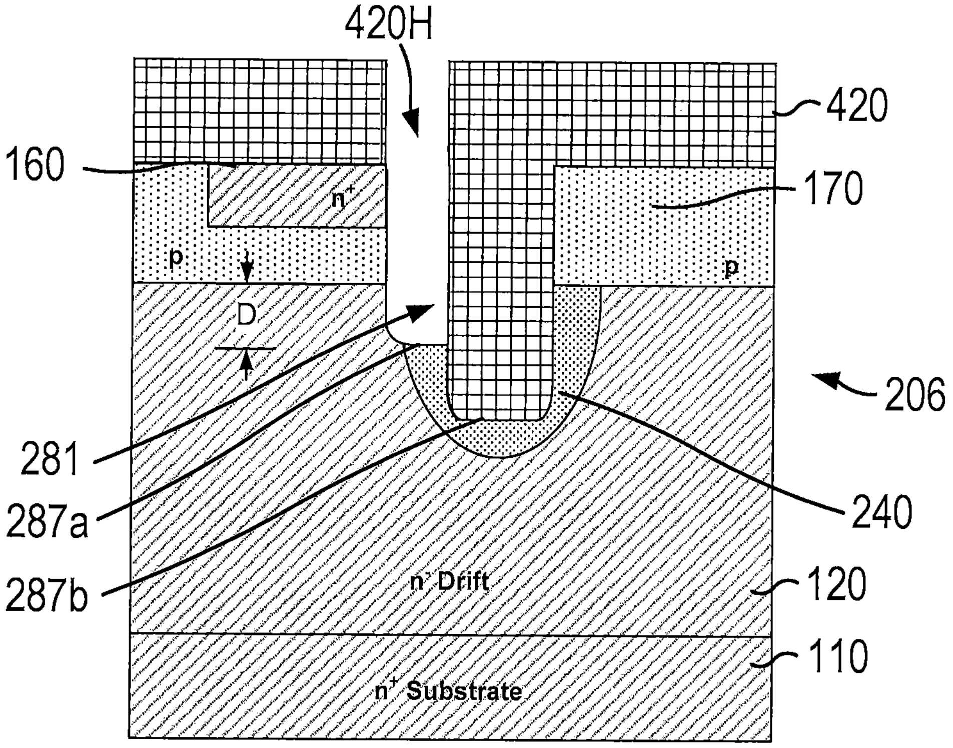

Referring to FIG. 4D, an etching process may be performed through the hole 420H in the second mask 420. The etching process may be an anisotropic etch that removes portions of the p-type well region 170 and/or the drift region 120 to form the first trench 281. The etching process may be configured to control a level at which a bottom surface 287*a* of the first trench 281 is formed. A bottom surface 287*a* of the first trench 281 may be formed at a first level in the drift region 120. The etching process may be configured to control the depth D from a lower surface of the p-type well region 170 at which a bottom surface 287*a* of the first trench 281 is formed. In some embodiments, the depth D may be configured to be similar to the first depth D1 illustrated in FIG. 2A. In some embodiments, the depth D may be configured to be similar to the second depth D2 illustrated in FIG. 2B. That is to say that the position of the first corner 290*a*, 290*a*' (see FIGS. 2A and 2B) may be controlled by controlling a depth of the etching of the first trench 281.

In some embodiments, the etching of the first trench 281 may remove portions of one sidewall of the second trench 282. As a result, portions of the sidewall of the second trench 282 that may have been implanted and/or damaged by the ion implantation process 425 may be removed. The bottom surface 287*b* of the second trench 282 may be deeper than the first level of the bottom surface 287*a* of the first trench 281. In some embodiments, the second trench 282 is connected to the first trench 281. For example, in some embodiments, a sidewall of the second trench 282 may connect to a bottom or a sidewall of the first trench 281. In some embodiments, the second trench 282 may be located at one side of the first trench 281. In FIG. 4D, the second trench 282 is located at the right side of the first trench 281, but it will be understood that the present disclosure is not limited thereto. The first trench 281 and the second trench 282 may form the gate trench 280.

Referring back to FIG. 4D, the second mask 420 may be removed and the processing of the device may continue similarly to the processes described with respect to FIGS. 3G and 3H, to form the MOSFET devices 200A and 200B illustrated in FIGS. 2A and 2B. In some embodiments, the activation of the implanted ions of the deep shielding pattern 240 may be performed after the ion implantation process 425. In some embodiments, the activation may be performed before the formation of the first trench 281, but in some embodiments the activation may be performed after the formation of the first trench 281.

In some embodiments, prior to forming the gate insulating layer, additional processing (e.g., etching and/or oxidation) may be performed on the second corner 290*b*, 290*b*' that is formed at the interface between the first trench 281 and the second trench 282. The additional processing may be performed to increase a radius of curvature of the second corner 290*b*, 290*b*'. By increasing the radius of curvature (e.g., making the second corner 290*b*, 290*b*' less sharp), the corner may be better protected from electric field crowding. Additional processing to alter the second corner 290*b*, 290*b*' is optional, however. In some embodiments, the etching of the first trench 281 after the formation of the second trench 282 may naturally increase the radius of curvature of the second corner 290*b*, 290*b*'.

Figure 5A:
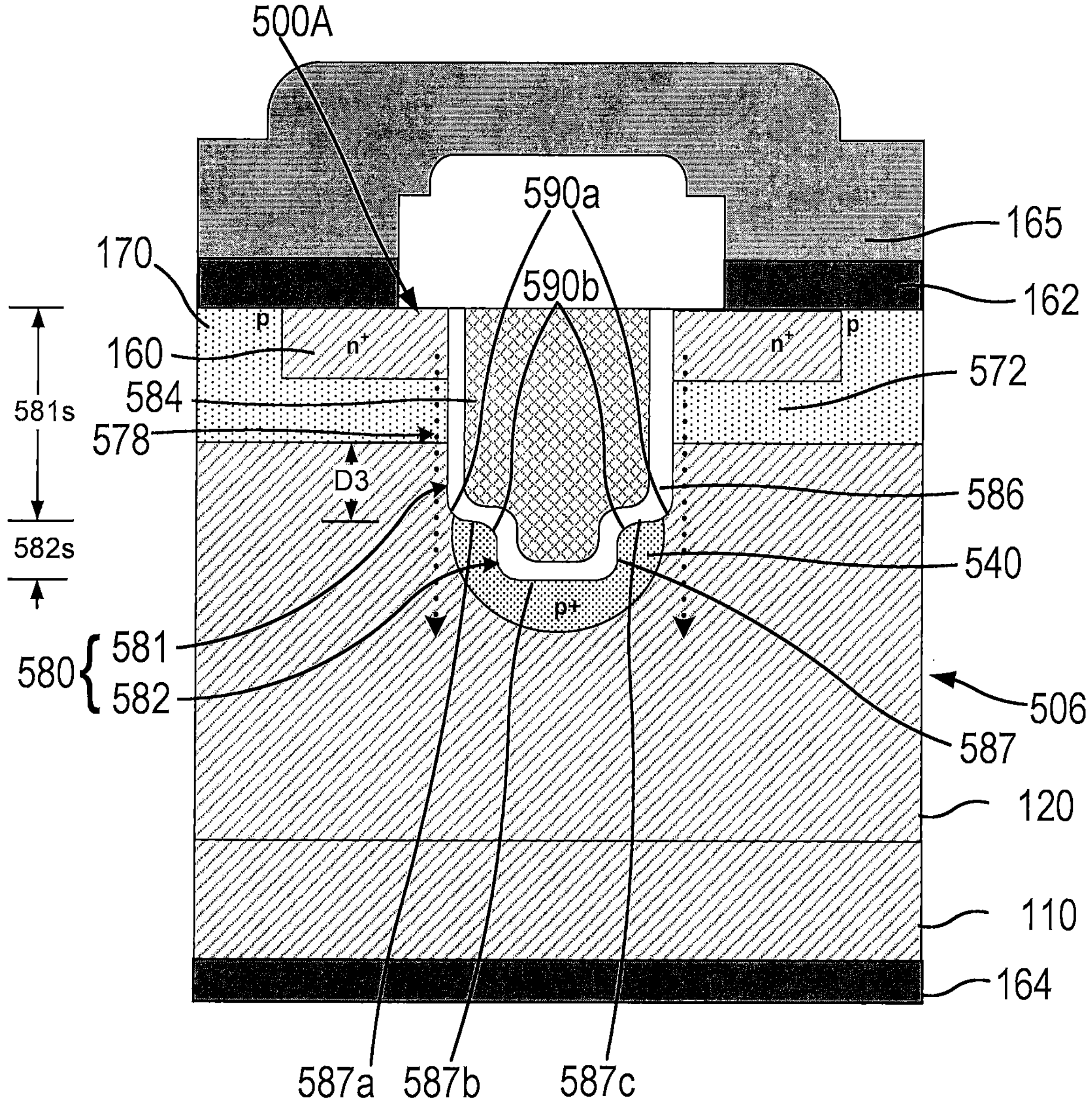
FIGS. 5A and 5B are schematic cross-sectional diagrams of MOSFET devices according to some embodiments of the present disclosure.
Figure 5B:
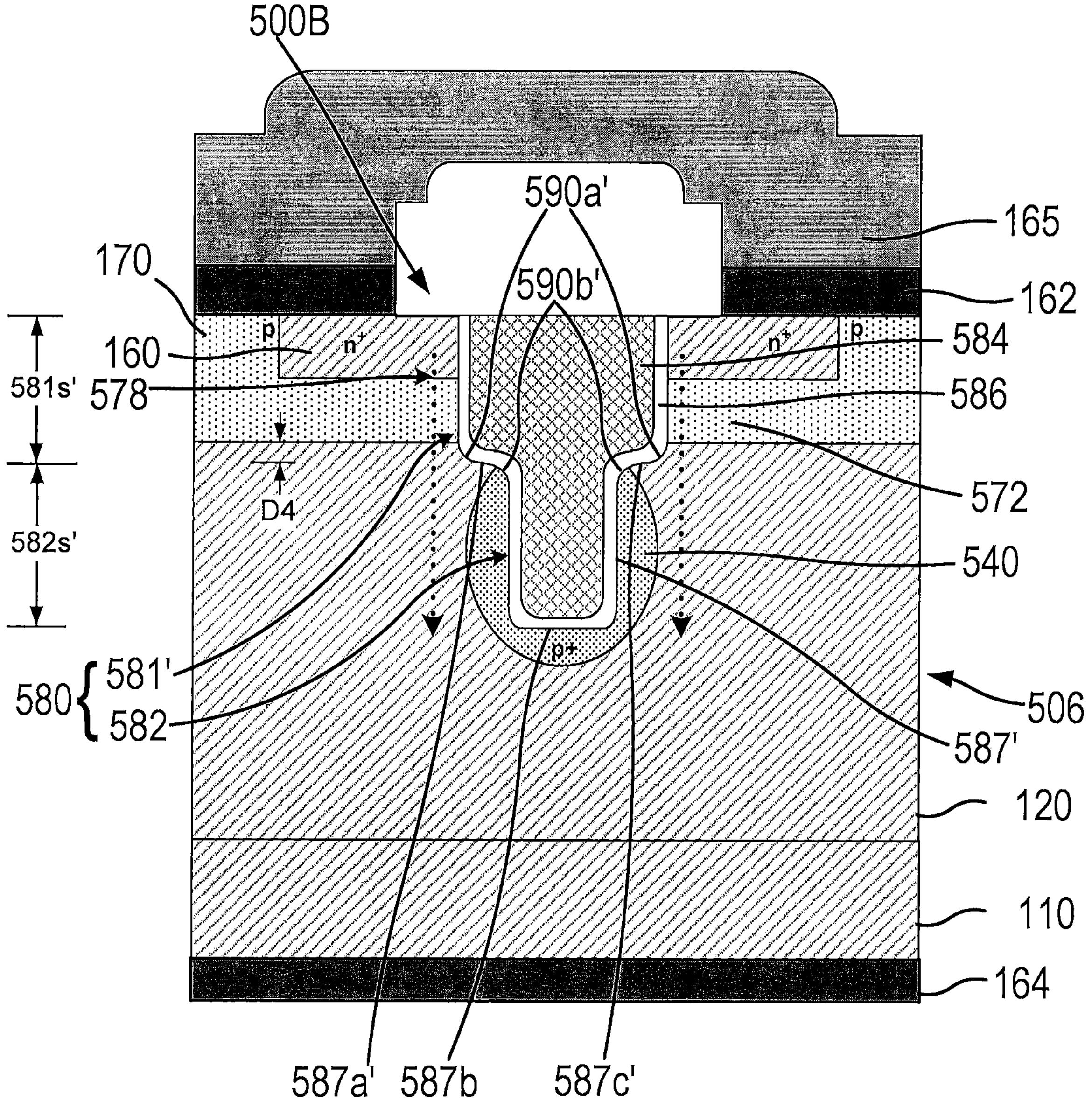

Though the prior embodiments have described MOSFET devices having an asymmetric p+ shielding, the present disclosure is not limited thereto. In some embodiments, improved gate trench MOSFET devices may include configurations in which channels are provided on both sides of the gate trench. FIGS. 5A and 5B are schematic cross-sectional diagrams of MOSFET devices 500A, 500B according to some embodiments of the present disclosure. FIGS. 5A and 5B include references to elements that are the same or similar to those discussed herein with respect to FIGS. 2A and 2B. As such, the description of FIGS. 5A and 5B will focus on the differences between the MOSFET devices 500A, 500B and the MOSFET devices 200A, 200B.

Referring to FIG. 5A, the power MOSFET 500A may include a highly-doped n-type (n+) wide band-gap semiconductor substrate 110 (e.g., silicon carbide). A lightly-doped n-type (n−) drift region 120 (e.g., silicon carbide) may be provided on the substrate 110. In some embodiments, an upper portion of the n-type drift region 120 may comprise an n-type current spreading layer (not shown) that is more heavily doped than the lower portion of the n-type drift region 120. A moderately-doped p-type well region 170 (e.g., silicon carbide) may be formed on the upper surface of the n-type drift region 120. This moderately-doped p-type well region 170 may provide p-wells 572 for the MOSFET device 500A. A heavily-doped $n^+$ source region 160 (e.g., silicon carbide) may be formed in an upper region of the p-type well region 170. The substrate 110, drift region 120, the moderately doped p-type well region 170, and the heavily-doped $n^+$ source region 160, along with the various regions/patterns formed therein, comprise a semiconductor layer structure 506 of the MOSFET 500A.

Gate trench 580 may be formed in the semiconductor layer structure 506. The gate trench 580 may extend through the heavily-doped $n^+$ source region 160 and the moderately-doped p-type well region 170 and into the drift region 120. The gate trench 580 may include a first trench 581 and a second trench 582. A depth of the first trench 581 may be shallower than the second trench 582. In some embodiments, the second trench 582 is connected to the first trench 581. For example, in some embodiments, both sidewalls of the second trench 582 may connect to a bottom of the first trench 581. In some embodiments, the second trench 582 may be located at a center portion of the first trench 581. For example, the second trench 582 may provide a recess that extends from a bottom of the first trench 581.

The configuration of the first trench 581 and the second trench 582 may result in a gate trench 580 having a non-linear bottom surface 587. The bottom surface 587 may have a first portion 587*a* at a first level, a second portion 587*b* at a second level, and a third portion 587*c* at a third level. In some embodiments, the first level and the third level may be a same level. In some embodiments, the second level is different from the first level and the third level. The first portion 587*a* and the third portion 587*c* of the bottom surface 587 may correspond to a bottom surface of the first trench 581. The second portion 587*b* of the bottom surface 587 may correspond to a bottom surface of the second trench 582. In some embodiments, the second level of the second portion 587*b* may be deeper (e.g., closer to the substrate 110) than the first level of the first portion 587*a* and the third level of the third portion 587*c*. The first level of the first portion 587*a* and the third level of the third portion 587*c* of the bottom surface 587 may be a third distance D3 from the bottom of the p-well 572. In other words, the first level of the first portion 587*a* and the third level of the third portion 587*c* may extend into the drift region 120 by a third distance D3 farther than the p-well 572. The first, second, and third levels of the bottom surface 587 may result in a recess within the bottom surface 587 of the gate trench 580 that protrudes towards the substrate 110. The recess of the gate trench 580 may extend from the central portion of the gate trench 580. Thus, the bottom surface 587 may have central portion (e.g., portion 587*b*) that extends deeper into the drift region 120 than the edge portions (e.g., portions 587*a* and 587*c*).

A deep shielding pattern 540 may be formed on the bottom surface 587 of the gate trench 580. The deep shielding pattern 540 may be a heavily-doped ($p^+$) (e.g., silicon carbide) pattern that is formed in the upper surface of the n-type drift region 120 by ion implantation. In some embodiments, the deep shielding pattern 540 may have a doping concentration of, for example, between $1\times10^{17}/cm^3$ and $1\times10^{21}/cm^3$. In some embodiments, the deep shielding pattern 540 may be on the first portion 587*a*, the second portion 587*b*, and/or third portion 587*c* of the bottom surface 587 of the gate trench 580. In some embodiments, the deep shielding pattern 540 may extend along substantially the entire bottom surface of the second trench 582. In some embodiments, the deep shielding pattern 540 may be between the bottom and sidewalls of the second trench 582 and the drift region 120. In some embodiments, the deep shielding pattern 540 may not cover all of the sidewalls or bottom surfaces of the first trench 581. That is to say that portions of the first trench 581 may directly abut the drift region 120 without a portion of the deep shielding pattern 540 thereon.

The use of the first trench 581 and the second trench 582 results in the formation of two outer corners 590*a* and two inner corners 590*b* of the gate trench 580. The two outer corners 590*a* may be corners between the bottom surface of the first trench 581 (e.g., first portion 587*a* and third portion 587*c*) and respective sidewalls of the first trench 581. The inner corners 590*b* may be corners between the bottom surface of the first trench 581 (e.g., first portion 587*a* and third portion 587*c*) and respective sidewalls of the second trench 582. In some embodiments, a radius of curvature of the inner corners 590*b* may be greater than a radius of curvature of the outer corners 590*a*. In some embodiments, at least a portion of the outer corners 590*a* may abut the drift region 120 without a portion of the deep shielding pattern 540 thereon. In some embodiments, the inner corners 590*b* may be covered by the deep shielding pattern 540.

The deep shielding pattern 540 may extend along sidewalls and the bottom surface of the second trench 582. The deep shielding pattern may expose (e.g., not extend on) at least portions of the sidewalls of the first trench 581. The sidewalls of the gate trench 580 may form channels 578 on both sides of the gate trench 580 for the MOSFET 500A. As with the device of FIG. 1A, the MOSFET 500A may have channels 578 conducting on both sides of the gate trench 580 during operation. In contrast to the embodiments of FIG. 1A, however, the use of the first and second trenches 581, 582 in the MOSFET 500A may allow for improved protection for the outer corners 590*a* of the gate trench 580. In the MOSFET 500A, the deep shielding pattern 540 is formed deeper (e.g., nearer the substrate 110) than in a related device (such as the MOSFET 100A of FIG. 1A). Having the deep shielding pattern 540 deeper in the drift region 120 provides better protection from the electrical field for the outer corners 590*a* during blocking operations. The use of the deeper second trench 582 allows for the deep shielding pattern 540 to be formed without excessive implant energy.

The formation of the first gate trench 581 and the second gate trench 582 may result in the formation of a first sidewall of the first gate trench 581 having a first depth 581*s* and a second sidewall 582*s* of the second gate trench 582 having a second depth 582*s*. The first depth of the first sidewall 581*s* may be a depth (e.g., a dimension in a direction perpendicular to a top surface of the substrate) of a portion of a sidewall of the first gate trench 581 that extends from a top surface of the semiconductor layer structure 506 to one of the outer corners 590*a*. The second depth of the second sidewall 582*s* may be a depth of a portion of a sidewall of the second gate trench 582 that extends from one of the inner corners 590*b* to a bottom surface of the second gate trench 582. In some embodiments, a ratio of the depth of the first sidewall 581*s* to the second sidewall 582*s* (e.g., 581*s*/582*s*) may be one or greater. In some embodiments, the ratio of the depth of the first sidewall 581*s* to the second sidewall 582*s* may be between 1 and 20. In some embodiments, the ratio of the depth of the first sidewall 581*s* to the second sidewall 582*s* may be between 1 and 10. In some embodiments, the ratio of the depth of the first sidewall 581*s* to the second sidewall 582*s* may be between 1 and 5. In some embodiments, the ratio of the depth of the first sidewall 581*s* to the second sidewall 582*s* may be between 2 and 10. The first depth of the first sidewall 581*s* may also represent a distance between the top surface of the semiconductor layer structure 506 and the first portion 587*a* of the bottom surface 587 of the gate trench 580. The second depth of the second sidewall 582*s* may also represent a distance between the first portion 587*a* and the second portion 587*b* of the bottom surface 587 of the gate trench 580.

Referring back to FIG. 5A, gate insulating layer 586 may be formed on the bottom surface and sidewalls of the gate trench 580, including the first trench 581 and the second trench 582. A gate electrode 584 may be formed on the gate insulating layer 586 to fill the gate trench 580.

Source contacts 162 may be formed on the heavily-doped n-type source regions 160. A wiring layer 165 may connect various ones of the source contacts 162. A drain contact 164 may be formed on the lower surface of the substrate 110. A gate contact (not shown) may be formed on the gate electrode 584.

Though FIG. 5A illustrates a first trench 581 having a bottom surface that is separated from the p-well 572 by a third distance D3, it will be understood that the present disclosure is not limited thereto. In some embodiments, the distance of the bottom surface 587*a*, 587*c* of the first trench 581 may be varied. For example, FIG. 5B illustrates an example embodiment of a MOSFET device 500B of the present disclosure in which first trench 581 is separated from the p-well 572 by a fourth distance D4, where the fourth distance D4 is smaller than the third distance D3. Elements of FIG. 5B that are substantially similar to those of FIG. 5A will not be described for brevity.

Referring to FIG. 5B, a depth of a first trench 581' may be made shallower than the embodiment illustrated in FIG. 5A. For example, the first portion 587*a*' and the third portion 587*b*' of the bottom surface 587' of the gate trench 580 may be formed closer to the surface of the semiconductor layer structure 506. As a result, a distance that separates the first portion 587*a*' and third portion 587*c*' from the second portion 587*b* of the bottom surface 587' may increase. The shallower first trench 581' may result in the outer corners 590*a*' being placed closer to the p-well 572. The embodiment of FIG. 5B may result in better protection for the outer corners 590*a*' during reverse blocking, while the embodiment of FIG. 5A may provide a JFET region with a larger width so that current flow is improved over the embodiment of FIG. 5B.

Still referring to FIG. 5B, the formation of the first gate trench 581' and the second gate trench 582 may result in the formation of a first sidewall of the first gate trench 581' having a first depth 581*s*' and a second sidewall of the second gate trench 582 having a second depth 582*s*'. The first depth of the first sidewall 581*s*' may be a depth of a portion of a sidewall of the first gate trench 581' that extends from a top surface of the semiconductor layer structure 506 to one of the outer corners 590*a*'. The second depth of the second sidewall 582*s*' may be a depth of a portion of a sidewall of the second gate trench 582 that extends from one of the inner corners 590*b*' to a bottom surface of the second gate trench 582. In some embodiments, a ratio of the depth of the first sidewall 581*s*' to the second sidewall 582*s*' (e.g., 581*s*'/582*s*') may be one or less. In some embodiments, the ratio of the depth of the first sidewall 581*s*' to the second sidewall 582*s*' may be between 0.1 and 1. In some embodiments, the ratio of the depth of the first sidewall 581*s*' to the second sidewall 582*s*' may be between 0.05 and 1. In some embodiments, the ratio of the depth of the first sidewall 581*s*' to the second sidewall 582*s*' may be between 0.2 and 1. In some embodiments, the ratio of the depth of the first sidewall 581*s*' to the second sidewall 582*s*' may be between 0.1 and 0.5. The first depth of the first sidewall 581*s*' may also represent a distance between the top surface of the semiconductor layer structure 506 and the first portion 587*a*' of the bottom surface 587' of the gate trench 580. The second depth of the second sidewall 582*s*' may also represent a distance between the first portion 587*a*' and the second portion 587*b* of the bottom surface 587' of the gate trench 580.

FIGS. 6A to 6F are schematic cross-sectional views illustrating methods of manufacturing the power switching devices 500A, 500B of FIGS. 5A and 5B according to some embodiments of the present disclosure. A description of those elements of FIGS. 6A to 6F that are the same or similar to those of FIGS. 2A and 2B will be omitted for brevity. Accordingly, the description of FIGS. 6A to 6F will focus on differences with the figures previously described.

Figure 6A:
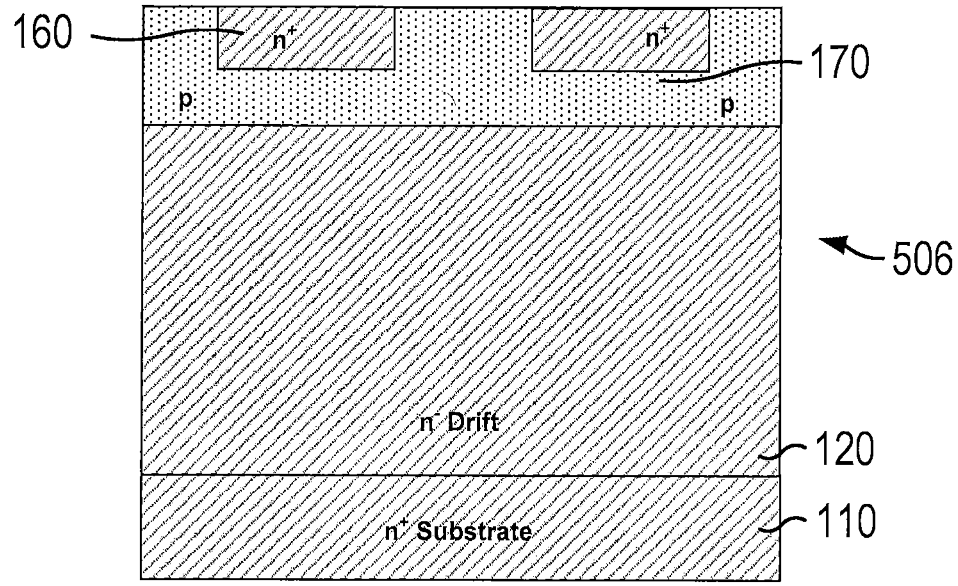
FIGS. 6A to 6F are schematic cross-sectional views illustrating methods of manufacturing the power switching devices of FIGS. 5A and 5B according to some embodiments of the present disclosure.

Referring to FIG. 6A, a substrate 110 is provided and a drift region 120 is formed on the substrate 110 via epitaxial growth. In some embodiments, the substrate 110 is a heavily-doped ($n^+$) n-type silicon carbide and the drift region 120 is a lightly-doped ($n^-$) silicon carbide drift region 120. In some embodiments, an n-type silicon carbide current spreading layer may be formed that comprises the upper portion of the drift region 120.

A moderately-doped p-type well region 170 may be formed on the upper surface of the n-type drift region 120 and heavily-doped ($n^+$) n-type source regions 160 may be formed in an upper portion of the p-type well region 170. In some embodiments, the p-type well region 170 may be formed by epitaxial growth. In some embodiments, the p-type well region 170 may be formed by ion implantation. In some embodiments, a doping concentration of the p-type well region 170 may be non-uniform. For example, in some embodiments, upper portions of the p-type well region 170 may have a higher doping concentration than lower portions of the p-type well region 170. In some embodiments, ion implantation may be used to form the source regions 160 in the p-type well region 170. The n-type source regions 160, the p-type well region 170, drift region 120, and substrate 110 may form semiconductor layer structure 506.

Figure 6B:
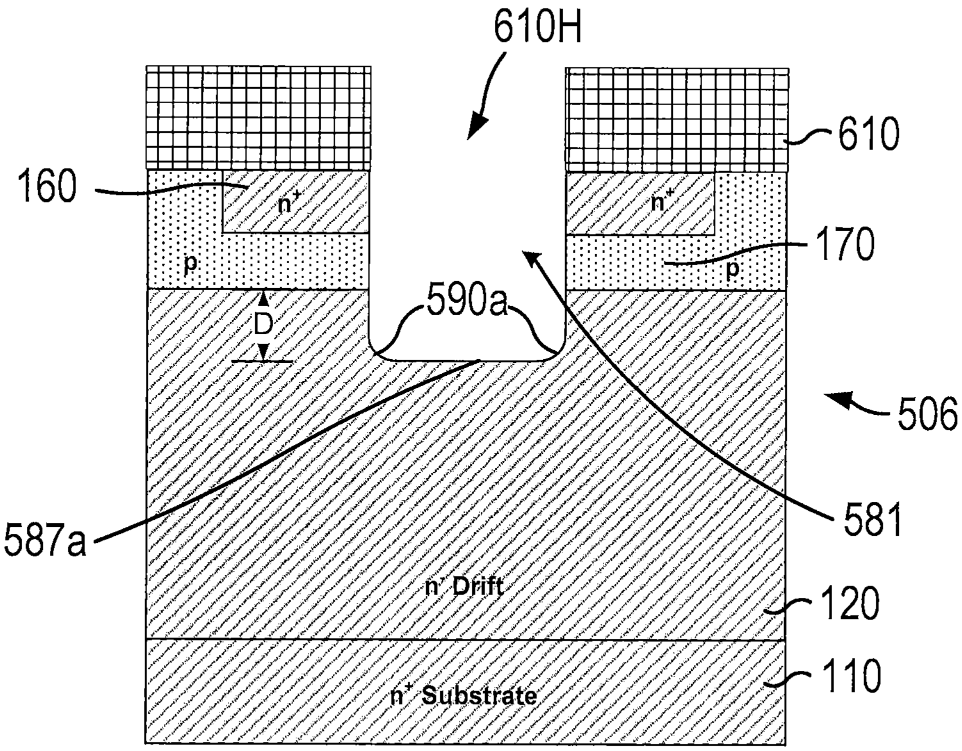

Referring to FIG. 6B, a first mask 610 may be formed on an upper surface of the semiconductor layer structure 506. The first mask 610 may have a hole 610H that exposes an upper surface of the p-type well region 170 between two adjacent n-type source regions 160.

An etching process may be performed through the hole 610H in the first mask 610. The etching process may be an anisotropic etch that removes portions of the p-type well region 170 and the drift region 120 to form the first trench 581. A bottom surface 587*a* of the first trench 581 may be formed at a first level in the drift region 120. The etching process may be configured to control the depth D from a lower surface of the p-type well region 170 to which a bottom surface 587*a* of the first trench 581 is formed. In some embodiments, the depth D may be configured to be similar to the third depth D3 illustrated in FIG. 5A. In some embodiments, the depth D may be configured to be similar to the fourth depth D4 illustrated in FIG. 5B. That is to say that the position of the outer corners 590*a*, 590*a*' (see FIGS. 5A and 5B) may be controlled by controlling a depth of the etching of the first trench 581.

Figure 6C:
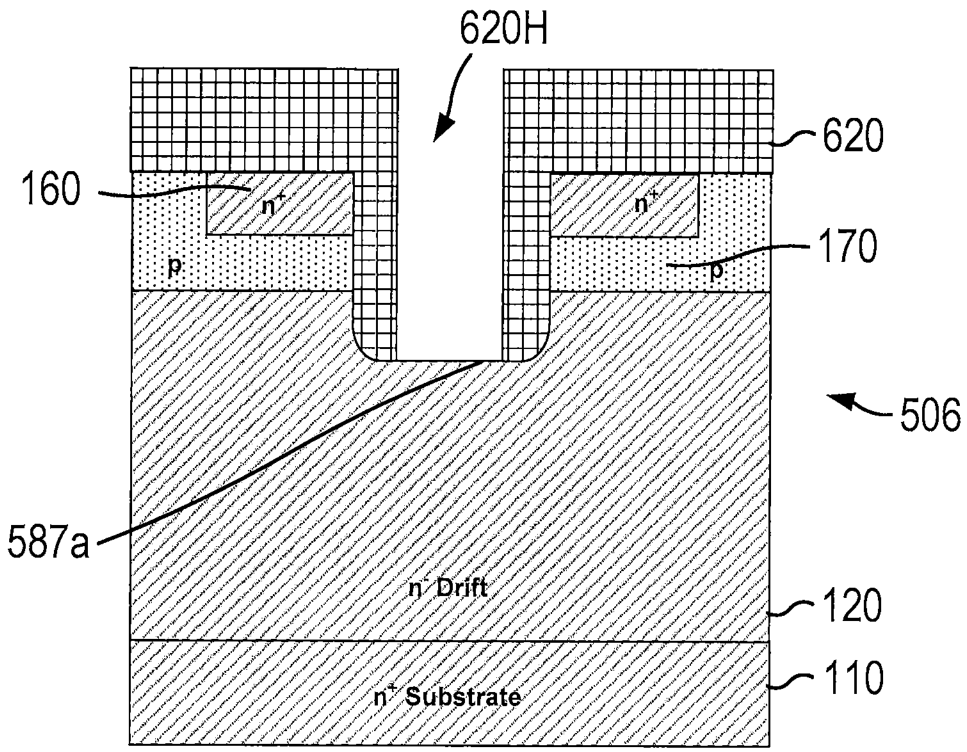

Referring to FIG. 6C, a second mask 620 may be formed on an upper surface of the semiconductor layer structure 506 and within the first trench 581. The second mask 620 may have a hole 620H that exposes a portion of the bottom surface 587*a* of the first trench 581. The second mask 620 may cover opposing sidewalls of the first trench 581. In some embodiments, the second mask 620 may be formed after removing the first mask 610. In some embodiments, the second mask 620 may be formed by adding additional mask structures to the first mask 610.

Figure 6D:
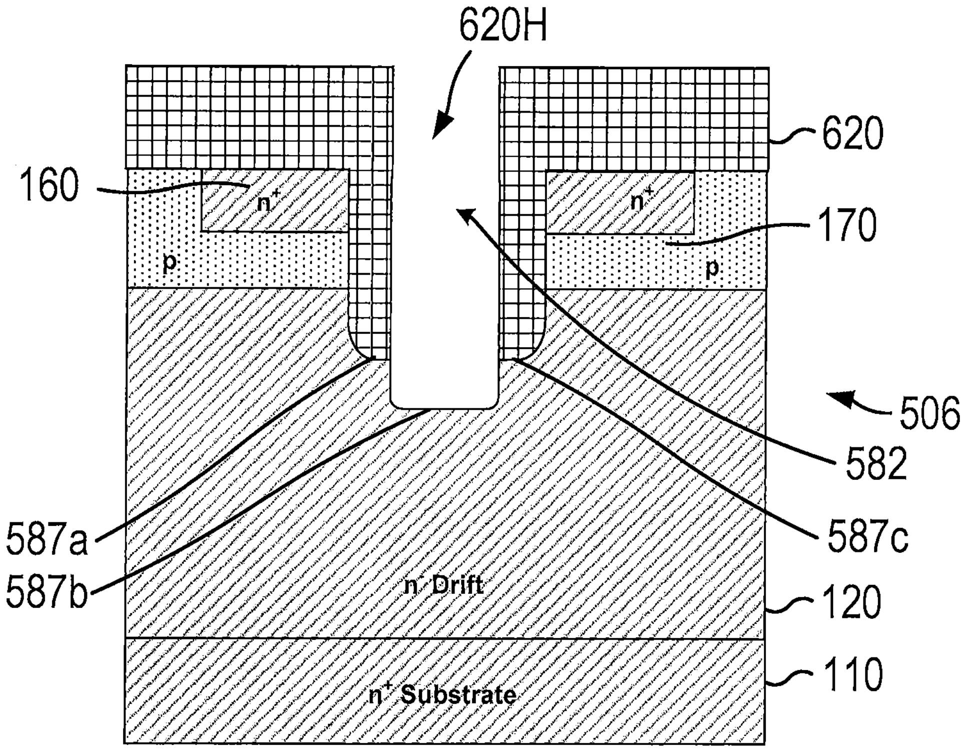

Referring to FIG. 6D, an etching process may be performed through the hole 620H in the second mask 620. The etching process may be an anisotropic etch that removes portions of the drift region 120 to form the second trench 582. The etching process may be configured to control a second level at which a bottom surface 587*b* of the second trench 582 is formed. The configuration of the first trench 581 and the second trench 582 may result in a gate trench 580 having a non-linear bottom surface 587. The bottom surface 587 may have a first portion 587*a* at a first level, a second portion 587*b* at a second level, and a third portion 587*c* at a third level. The formation of the second trench 582 may intersect the bottom surface 587*a* of the first trench 581 to form the first portion 587*a* and the third portion 587*c* of the bottom surface of the first trench 581. The bottom surface 587*b* of the second trench 582 may be deeper than the first level of the first portion 587*a* and the third portion 587*c* of the first trench 581. In some embodiments, the second trench 582 is connected to the first trench 581. The first through third levels of the bottom surface 587 may result in a recess in the bottom surface 587 of the gate trench 580 that protrudes towards the substrate 110. The recess in the bottom surface 587 of the gate trench 580 may extend from the central portion of the gate trench 580. Thus, the bottom surface 587 may have central portion (e.g., second portion 587*b*) that extends deeper into the drift region 120 than the edge portions (e.g., first and third portions 587*a* and 587*c*).

Figure 6E:
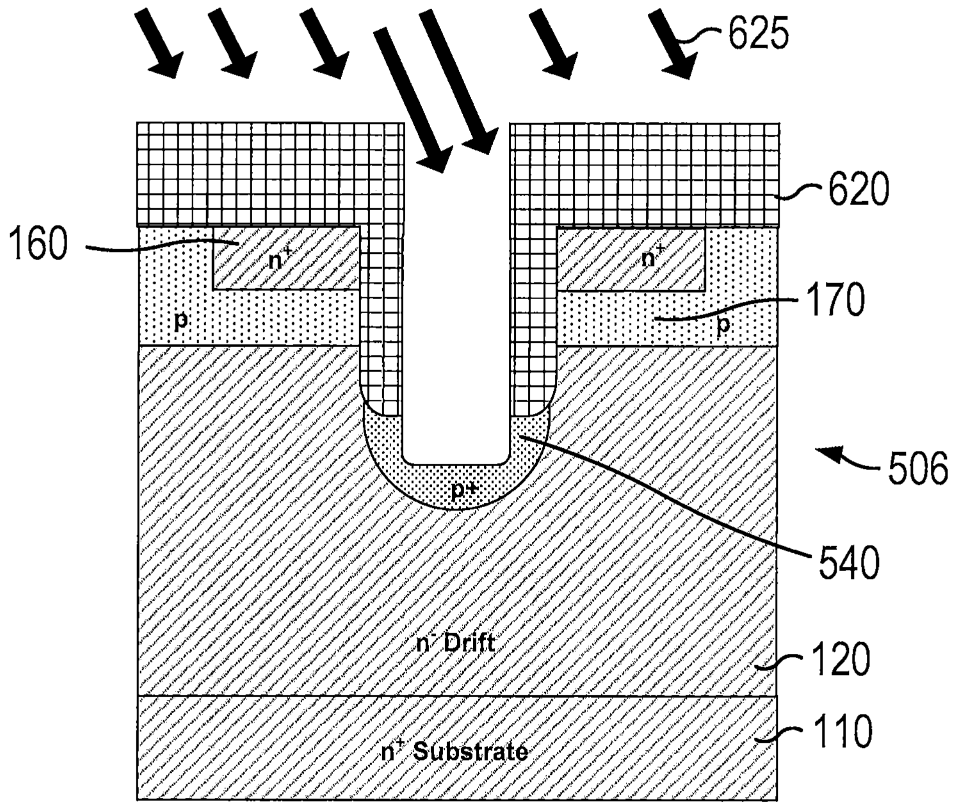

Referring to FIG. 6E, an ion implantation process 625 may be performed to form the p+ deep shielding pattern 540. In some embodiments, the ion implantation process 625 may include one or more angled and/or straight ion implantation processes. The ion implantation process 625 may result in a relatively deep ion implantation in the second trench 582. The ion implantation process 625 may result in the formation of the deep shielding pattern 540 on portions of the sidewalls and bottom surface of the second trench 582. Because of the second mask 620, sidewalls of the first trench 581 may be protected from the ion implantation. For example, the sidewall of the first trench 581 adjacent the n-type source regions 160 may not be implanted by the ion implantation process 625. In some embodiments, the ion implantation process may be followed by activation of the implanted ions.

In some embodiments, a spacer dielectric such as, for example, silicon oxide or silicon nitride, may be deposited within the second trench 582 prior to performing the ion implantation process 625. The addition of the spacer dielectric may allow for the adjustment of the implantation depth and allow for more precise control of lateral straggle of the implanted ions.

Figure 6F:
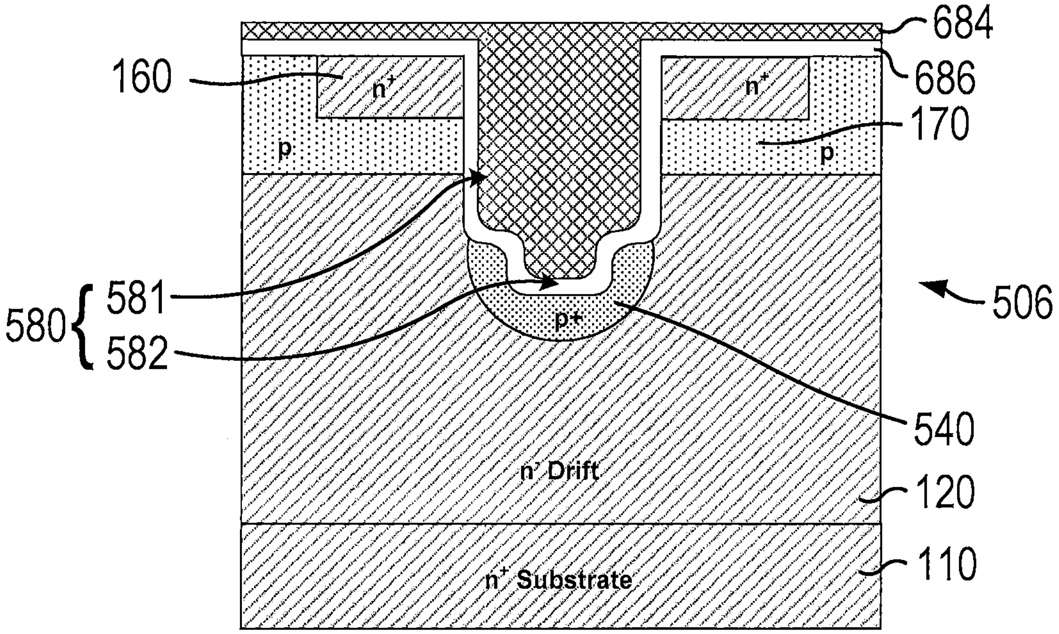

Referring to FIG. 6F, the second mask 620 may be removed and a gate insulating layer 686 may be formed on the upper surface of the semiconductor layer structure 506 and in the gate trench 580 (including the first trench 581 and the second trench 582). The gate insulating layer 686 may comprise, for example, a silicon dioxide ($SiO_2$) layer, although other insulating materials, such as $SiO_xN_y$, $Si_xN_y$, $Al_2O_3$ and/or high-K dielectrics such as hafnium oxide, and the like may be used.

In some embodiments, prior to forming the gate insulating layer 686, additional processing (e.g., etching and/or oxidation) may be performed on the two inner corners 590*b*, 590*b*' (see FIGS. 5A and 5B) of the gate trench 580 that are formed at the interface between the first trench 581 and the second trench 582. The additional processing may be performed to increase a radius of curvature of the inner corners 590*b*, 590*b*'. By increasing the radius of curvature (e.g., making the inner corners 590*b*, 590*b*' less sharp), the corners may be better protected from electric field crowding. Additional processing to alter the inner corners 590*b*, 590*b*' is optional, however. In some embodiments, the etching of the second trench 582 after the formation of the first trench 581 may naturally increase the radius of curvature of the inner corners 590*b*, 590*b*'.

An electrode layer 684 may be formed on the gate insulating layer 686. The electrode layer 684 may also be formed within, and in some embodiments fill, the gate trench 580 (including the first trench 581 and the second trench 582). The electrode layer 684 may include, for example, a silicide, doped polycrystalline silicon (poly-Si or poly), and/or a stable conductor.

Referring back to FIGS. 5A and 5B, the electrode layer 684 and the gate insulating layer 686 may be etched to form the gate electrode 584 and the gate insulating layer 586. In some embodiments, an upper surface of the electrode 584 and the gate insulating layer 586 may be formed to be coplanar with an upper surface of the semiconductor layer structure 506, but the embodiments of the present disclosure are not limited thereto. In some embodiments, at least a portion of the gate insulating layer 586 may extend on the upper surface of the semiconductor layer structure 506. In some embodiments, a level of an upper surface of the gate electrode 584 may be above a level of the upper surface of the semiconductor layer structure 506.

Source contacts 162 may be formed on the heavily-doped n-type source regions 160. A wiring layer 165 may connect various ones of the source contacts 162. A drain contact 164 may be formed on the lower surface of the substrate 110. A gate contact (not shown) may be formed on the gate electrode 584.

In FIGS. 6A to 6F, the first trench 581 was formed before the second trench 582, but the embodiments of the present disclosure are not limited thereto. In some embodiments, the second trench 582 may be formed before the first trench 581.

FIGS. 7A to 7D are schematic cross-sectional views illustrating methods of manufacturing the power switching devices 500A, 500B of FIGS. 5A and 5B according to some embodiments of the present disclosure. A description of those elements of FIGS. 7A to 7D that are the same or similar to those figures previously described will be omitted for brevity. Accordingly, the description of FIGS. 7A to 7D will focus on differences with the figures previously described.

Figure 7A:
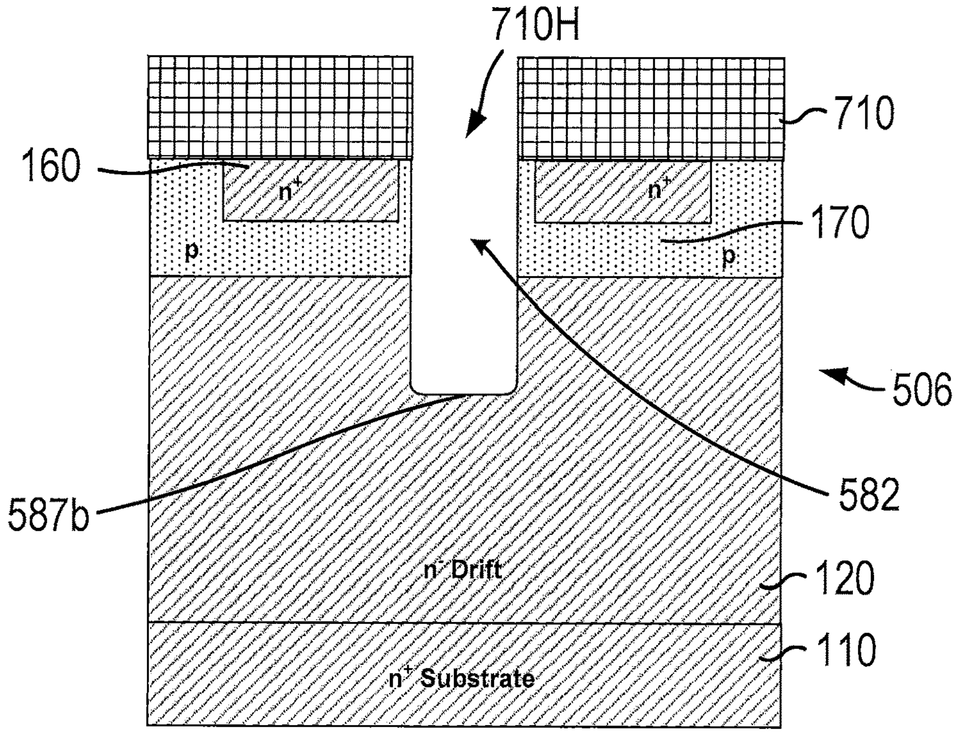
FIGS. 7A to 7D are schematic cross-sectional views illustrating methods of manufacturing the power switching devices of FIGS. 5A and 5B according to some embodiments of the present disclosure.

FIG. 7A illustrates a step of the process after the formation of the semiconductor layer structure 506 described with respect to FIG. 6A. Referring to FIG. 7A, a first mask 710 may be formed on an upper surface of the semiconductor layer structure 506. The first mask 710 may have a hole 710H that exposes an upper surface of the p-type well region 170. In some embodiments, the hole 710H exposes an upper surface of the p-type well region 170 that is offset from the n-type source regions 160. An etching process may be performed through the hole 710H in the first mask 710. The etching process may be an anisotropic etch that removes portions of the p-type well region 170 and the drift region 120 to form the second trench 582. A bottom surface 587*b* of the second trench 582 may be formed at a second level in the drift region 120.

Figure 7B:
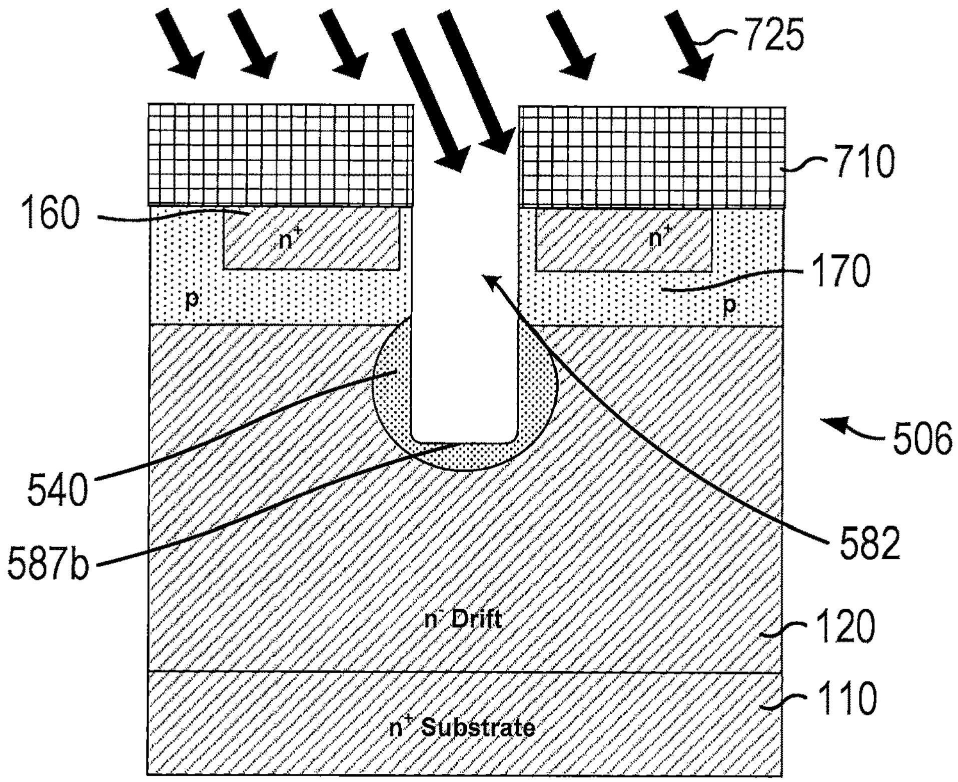

Referring to FIG. 7B, an ion implantation process 725 may be performed to form the p+ deep shielding pattern 540. In some embodiments, the ion implantation process 725 may include one or more angled and or straight ion implantation processes. The ion implantation process 725 may result in a relatively deep ion implantation in the second trench 582. The ion implantation process 725 may result in the formation of the deep shielding pattern 540 on portions of the sidewalls and bottom surface of the second trench 582. In some embodiments, additional p-type ions may be implanted in portions of the p-type well region 170. In some embodiments, the ion implantation process may be followed by activation of the implanted ions.

In some embodiments, a spacer dielectric such as, for example, silicon oxide or silicon nitride, may be deposited within the second trench 582 prior to performing the ion implantation process 725. The addition of the spacer dielectric may allow for the adjustment of the implantation depth and allow for more precise control of lateral straggle of the implanted ions.

Figure 7C:
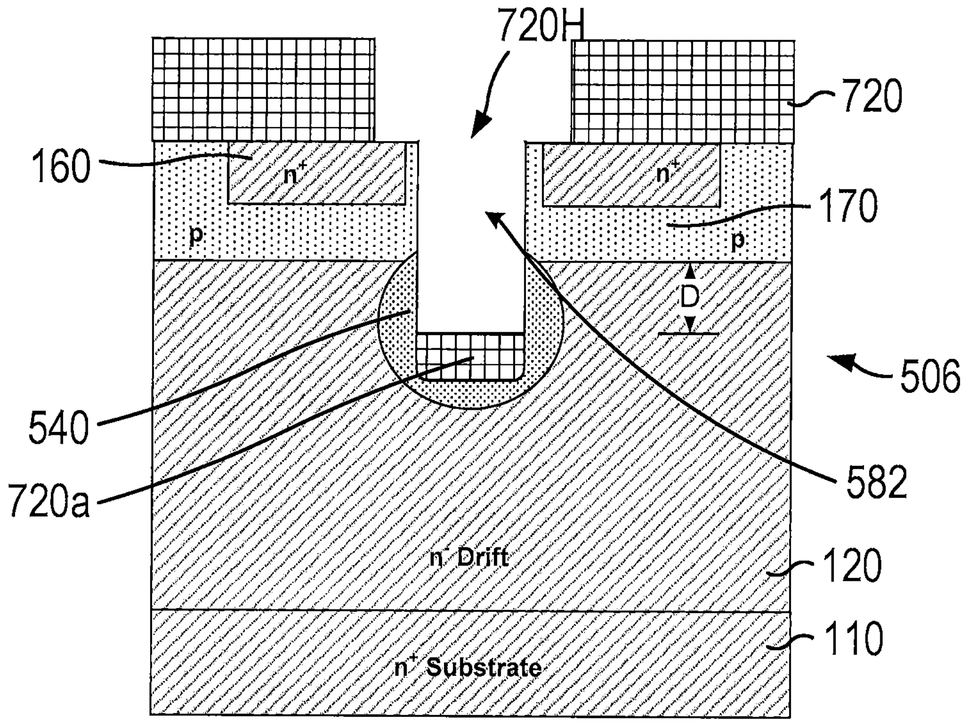

Referring to FIG. 7C, a second mask 720 may be formed on an upper surface of the semiconductor layer structure 506 and within the second trench 582. The second mask 720 may have a hole 720H that exposes an upper surface of the p-type well region 170 that is adjacent the n-type source region 160 on opposites sides of the second trench 582. In some embodiments, the second mask 720 may not completely fill the second trench 582. In some embodiments, an upper surface of a portion 720*a* of the second mask 720 in the second trench 582 may be formed at a distance D from a bottom surface of the p-type well region 170.

Figure 7D:
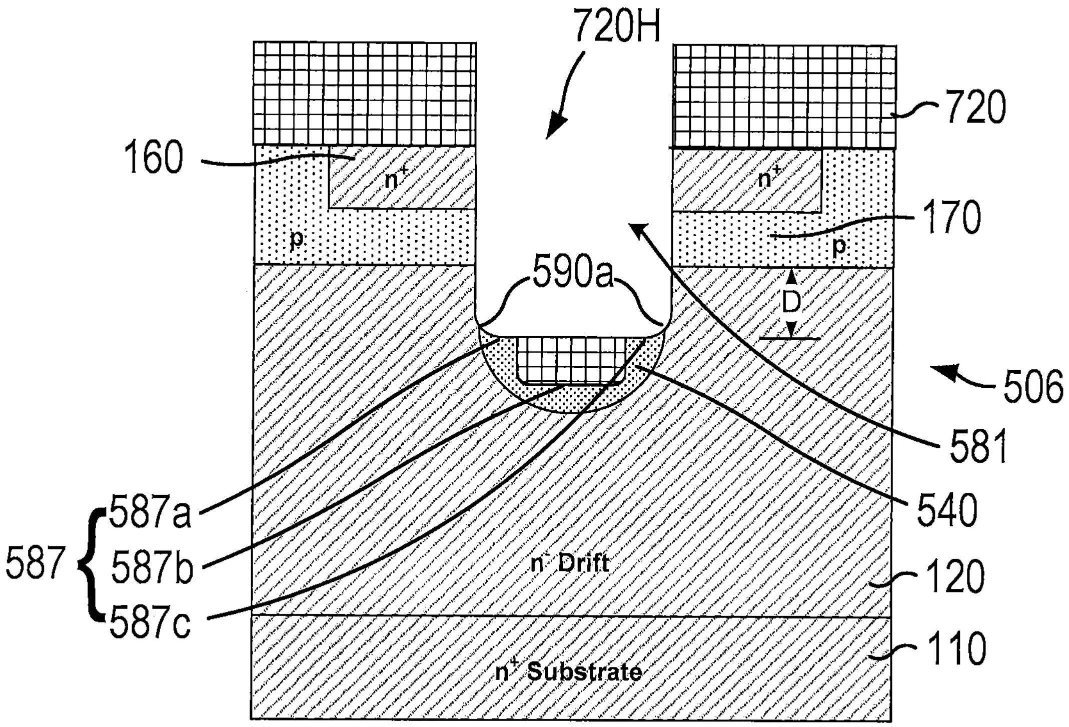

Referring to FIG. 7D, an etching process may be performed through the hole 720H in the second mask 720. The etching process may be an anisotropic etch that removes portions of the p-type well region 170 and/or the drift region 120 to form the first trench 581. The etching process may be configured to control a level at which a bottom surface of the first trench 581 is formed. A bottom surface of the first trench 281 may be formed to have a first portion 587*a* and a third portion 587*c* at a first level in the drift region 120. The etching process may be configured to control the depth D from a lower surface of the p-type well region 170 to which the bottom surface 587*a*, 587*c* of the first trench 581 is formed. In some embodiments, the depth D may be configured to be similar to the third depth D3 illustrated in FIG. 5A. In some embodiments, the depth D may be configured to be similar to the fourth depth D4 illustrated in FIG. 5B. That is to say that the position of the outer corners 590*a*, 590*a*' (see FIGS. 5A and 5B) may be controlled by controlling a depth of the etching of the first trench 581.

In some embodiments, the etching of the first trench 581 may remove portions of the sidewalls of the second trench 582. As a result, portions of the sidewalls of the second trench 582 that may have been implanted and/or damaged by the ion implantation process 725 may be removed. The bottom surface 587*b* of the second trench 582 may be deeper than the first level of the first and third portions 587*a*, 587*c* of the bottom surface of the first trench 581. In some embodiments, the second trench 582 is connected to the first trench 581. The first through third levels of the bottom surface 587 may result in a recess in the bottom surface 587 of the gate trench 580 that protrudes towards the substrate 110. The recess in the bottom surface 587 of the gate trench 580 may extend from the central portion of the gate trench 580. Thus, the bottom surface 587 may have central portion (e.g., portion 587*b*) that extends deeper into the drift region 120 than the edge portions (e.g., portions 587*a* and 587*c*). The first trench 581 and the second trench 582 may form the gate trench 580.

Referring back to FIG. 7D, the second mask 720 may be removed and the processing of the device may continue similarly to the processes described with respect to FIG. 6F, to form the MOSFET devices 500A and 500B illustrated in FIGS. 5A and 5B.

The present disclosure describes an approach that improves the ability of a transistor device to withstand damage due to electrical field crowding at corners of gate trenches. By providing a dual trench structure, embodiments described herein may allow for a device having improved performance characteristics and higher ruggedness, which may be particularly useful for improving the gate regions in a power transistor (e.g., a MOSFET, MISFET, or an IGBT).

While various ones of the embodiments discussed above illustrate the structure of a unit cell of an n-channel MOSFET, it will be appreciated that pursuant to further embodiments of the present invention, the polarity of each of the semiconductor layers in each device could be reversed so as to provide corresponding p-channel MOSFETs.

The invention has been described above with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on," "connected to," or "coupled to" another element or layer, it can be directly on, connected or coupled to the other element or layer, or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or elements, these regions, layers and/or elements should not be limited by these terms. These terms are only used to distinguish one region, layer or element from another region, layer or element. Thus, a first region, layer or element discussed below could be termed a second region, layer or element, and similarly, a second region, layer or element may be termed a first region, layer or element without departing from the scope of the present invention.

Relative terms, such as "lower" or "bottom" and "upper" or "top," may be used herein to describe one element's relationship to another element as illustrated in the drawings. It will be understood that relative terms are intended to encompass different orientations of the device in addition to the orientation depicted in the drawings. For example, if the device in the drawings is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, elements, and/or components, but do not preclude the presence or addition of one or more other features, elements, components, and/or groups thereof.

Embodiments of the invention are described herein with reference to cross-sectional illustrations that are schematic illustrations. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the invention.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

It will be understood that the embodiments disclosed herein can be combined. Thus, features that are pictured and/or described with respect to a first embodiment may likewise be included in a second embodiment, and vice versa.

While the above embodiments are described with reference to particular figures, it is to be understood that some embodiments of the present invention may include additional and/or intervening layers, structures, or elements, and/or particular layers, structures, or elements may be deleted. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A method of forming a semiconductor device, the method comprising:

providing a semiconductor layer structure;

etching a first gate trench into the semiconductor layer structure to a first level therein;

etching a second gate trench into the semiconductor layer structure to a second level therein, wherein etching the second gate trench is performed after etching the first gate trench, and wherein, after etching the second gate trench, at least a portion of the first gate trench is at the first level; and performing an ion implantation into a bottom surface of the second gate trench and into at least a portion of one sidewall of the second gate trench that extends from a top of the semiconductor layer structure, wherein, after performing the ion implantation, at least one corner of the first gate trench at the first level is free of the ion implantation, wherein the at least one corner of the first gate trench is adjacent a channel of the semiconductor device, wherein the second gate trench is deeper than the first gate trench, and wherein at least a portion of the second gate trench is connected to the first gate trench.

2. The method of claim 1, wherein etching the second gate trench is preceded by forming a mask on at least a portion of the first gate trench.

3. The method of claim 2, wherein the mask is on the at least one corner of the first gate trench, and at least one opposing corner of the first gate trench and the at least a portion of one sidewall of the second gate trench are free of the mask.

4. The method of claim 1, further comprising:

forming a gate insulating layer on the first gate trench and the second gate trench; and forming a gate electrode on the gate insulating layer.

5. The method of claim 1, wherein the semiconductor layer structure comprises a drift region having a first conductivity type, and wherein the method further comprises processing a corner of the drift region at an interface between the first gate trench and the second gate trench to increase a radius of curvature of the corner.

6. The method of claim 1, wherein performing the ion implantation into the bottom surface of the second gate trench comprises performing an angled ion implant, and wherein the at least one corner of the first gate trench at the first level is free of the angled ion implant and is adjacent a channel of the semiconductor device.

7. The method of claim 1, wherein the semiconductor layer structure comprises a drift region having a first conductivity type and a well region having a second conductivity type, and wherein performing the ion implantation into the bottom surface of the second gate trench comprises performing the ion implantation of a deep shielding pattern having the second conductivity type into a sidewall and the bottom surface of the second gate trench.

8. The method of claim 7, wherein the deep shielding pattern extends to contact at least a portion of the well region.

9. The method of claim 1, wherein the at least one corner of the first gate trench has a different radius of curvature than a corner of the second gate trench.

10. A method of forming a semiconductor device, the method comprising:

providing a semiconductor layer structure;

etching a first gate trench into the semiconductor layer structure to a first level therein;

etching a second gate trench into the semiconductor layer structure to a second level therein, wherein etching the second gate trench is performed before etching the first gate trench, and wherein, after etching the first gate trench at least a portion of the second gate trench is at the second level; and performing an ion implantation into a bottom surface of the second gate trench and into at least a portion of one sidewall of the second gate trench that extends from a top of the semiconductor layer structure, wherein, after performing the ion implantation, at least one corner of the first gate trench at the first level is free of the ion implantation, wherein the second gate trench is deeper than the first gate trench, and wherein at least a portion of the second gate trench is connected to the first gate trench.

11. The method of claim 10, wherein etching the first gate trench is preceded by forming a mask on at least a portion of the second gate trench.

12. The method of claim 10, wherein the second gate trench extends through a central portion of a bottom surface of the first gate trench, and wherein portions of the bottom surface of the first gate trench are on opposite sides of the second gate trench.

13. A method of forming a semiconductor device, the method comprising:

providing a semiconductor layer structure; and forming a gate trench in the semiconductor layer structure, wherein forming the gate trench comprises:

etching a first gate trench into the semiconductor layer structure to a first level therein; and after etching the first gate trench to the first level, etching a second gate trench into the semiconductor layer structure to a second level therein that is different from the first level, wherein, after etching the second gate trench, at least a portion of the first gate trench is at the first level such that the gate trench has a bottom surface comprising a first portion at the first level of the first gate trench and a second portion at the second level of the second gate trench, and the first gate trench comprises at least one corner having a different radius of curvature than a corner of the second gate trench, and further comprises first and second sidewalls that extend from a top of the gate trench to the first and second levels, respectively, wherein the first sidewall comprises a channel of the semiconductor device that is adjacent the at least one corner.

14. The method of claim 13, wherein the semiconductor layer structure comprises a substrate, and wherein the second level is closer to the substrate than the first level.

15. The method of claim 14, wherein the substrate comprises silicon carbide.

16. The method of claim 13, wherein providing the semiconductor layer structure comprises:

forming a drift region having a first conductivity type;

forming a well region having a second conductivity type on the drift region; and forming a deep shielding pattern having the second conductivity type below at least a portion of the bottom surface of the gate trench.

17. The method of claim 16, wherein the deep shielding pattern extends to contact at least a portion of the well region.

18. The method of claim 16, wherein the gate trench further comprises a first corner between the first sidewall of the gate trench and the first portion of the bottom surface of the gate trench, and a second corner between the first portion of the bottom surface of the gate trench and the second portion of the bottom surface of the gate trench.

19. The method of claim 18, wherein the deep shielding pattern is between the second corner and the drift region.

20. The method of claim 18, wherein at least a portion of the first corner of the gate trench is free of the deep shielding pattern.

21. A method of forming a semiconductor device, the method comprising:

providing a semiconductor layer structure; and forming a gate in a gate trench in the semiconductor layer structure, wherein the gate trench has a bottom surface comprising a first portion at a first level and a second portion at a second level, different from the first level, and further comprises first and second sidewalls that extend from a top of the gate trench to the first and second levels, respectively, wherein the gate trench further comprises a first corner between the first sidewall of the gate trench and the first portion of the bottom surface of the gate trench, and a second corner between the first portion of the bottom surface of the gate trench and the second portion of the bottom surface of the gate trench, and wherein a second radius of curvature of the second corner is greater than a first radius of curvature of the first corner.

22. A method of forming a semiconductor device, the method comprising:

providing a semiconductor layer structure comprising a drift region having a first conductivity type;

etching a first gate trench into the semiconductor layer structure;

etching a second gate trench into the semiconductor layer structure, wherein the second gate trench is connected to the first gate trench with a corner therebetween; and processing the corner between the first gate trench and the second gate trench to increase a radius of curvature of the corner.

23. The method of claim 22, wherein the corner is a second corner between a bottom surface of the first gate trench and a sidewall of the second gate trench, and further comprising:

performing an ion implantation into a bottom surface of the second gate trench, wherein a first corner between a sidewall of the first gate trench and the bottom surface of the first gate trench is free of the ion implantation.

24. The method of claim 23, wherein the radius of curvature of the second corner is greater than that of the first corner.

25. The method of claim 22, wherein the first gate trench comprises a first sidewall that extends from a top of the semiconductor layer structure to a bottom surface of the first gate trench, and the second gate trench comprises a second sidewall that extends from the top of the semiconductor layer structure to a bottom surface of the second gate trench.

* * * * *